(12) United States Patent
Kaviani

(10) Patent No.: US 6,943,597 B1
(45) Date of Patent: Sep. 13, 2005

(54) HARD PHASE ALIGNMENT OF CLOCK SIGNALS WITH AN OSCILLATOR CONTROLLER

(75) Inventor: Alireza S. Kaviani, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 11 days.

(21) Appl. No.: 10/803,338

(22) Filed: Mar. 17, 2004

Related U.S. Application Data

(63) Continuation-in-part of application No. 10/300,446, filed on Nov. 19, 2002, now Pat. No. 6,838,918.

(51) Int. Cl.$^7$ ................................................ H03L 7/00
(52) U.S. Cl. ................................... 327/145; 331/108 C
(58) Field of Search ......................... 327/141, 144–146, 327/155, 162–163; 331/62, 108 C–108 D, 172, 187, DIG. 2

(56) References Cited

U.S. PATENT DOCUMENTS

| | | | |
|---|---|---|---|
| 5,553,276 A | * | 9/1996 | Dean .......................... 713/500 |
| 5,790,058 A | * | 8/1998 | Burzio et al. ................ 341/101 |
| 6,107,826 A | | 8/2000 | Young et al. |
| 6,188,339 B1 | * | 2/2001 | Hasegawa .................... 341/101 |
| 6,191,613 B1 | | 2/2001 | Schultz et al. |
| 6,204,710 B1 | | 3/2001 | Goetting et al. |
| 6,255,880 B1 | | 7/2001 | Nguyen |
| 6,289,068 B1 | | 9/2001 | Hassoun et al. |
| 6,356,160 B1 | | 3/2002 | Robinson et al. |
| 6,373,308 B1 | | 4/2002 | Nguyen |
| 6,384,647 B1 | | 5/2002 | Logue |
| 6,400,734 B1 | | 6/2002 | Weigand |
| 6,501,306 B1 | * | 12/2002 | Kim et al. ................... 327/112 |

OTHER PUBLICATIONS

U.S. Appl. No. 09/684,529, filed Oct. 6, 2000, Logue et al.
U.S. Appl. No. 10/300,446, filed Nov. 19, 2002, Kaviani.
U.S. Appl. No. 10/803,823, filed Mar. 17, 2004, Kaviani.

* cited by examiner

*Primary Examiner*—My-Trang Nu Ton
(74) *Attorney, Agent, or Firm*—W. Eric Webostad; Justin Liu

(57) ABSTRACT

A oscillator controller (1300, 1500) is described. Differential logic receives a clock signal and an inverted version thereof (210, 210B) and an oscillator signal and an inverted version thereof (208, 208B), where the clock signal (210) and the oscillator signal (208) having different frequencies. The differential logic provides a differential output (1611, 1612) at least partially responsive to at least one of the clock signal and the oscillator signal. The differential logic is a combinational circuit in an oscillator alignment state and a sequential circuit in a hard-phase alignment state. Control signals (1317, 1318) are used in part to selectively alternate between putting the differential logic in the oscillator alignment state and in the hard-phase alignment state.

21 Claims, 29 Drawing Sheets

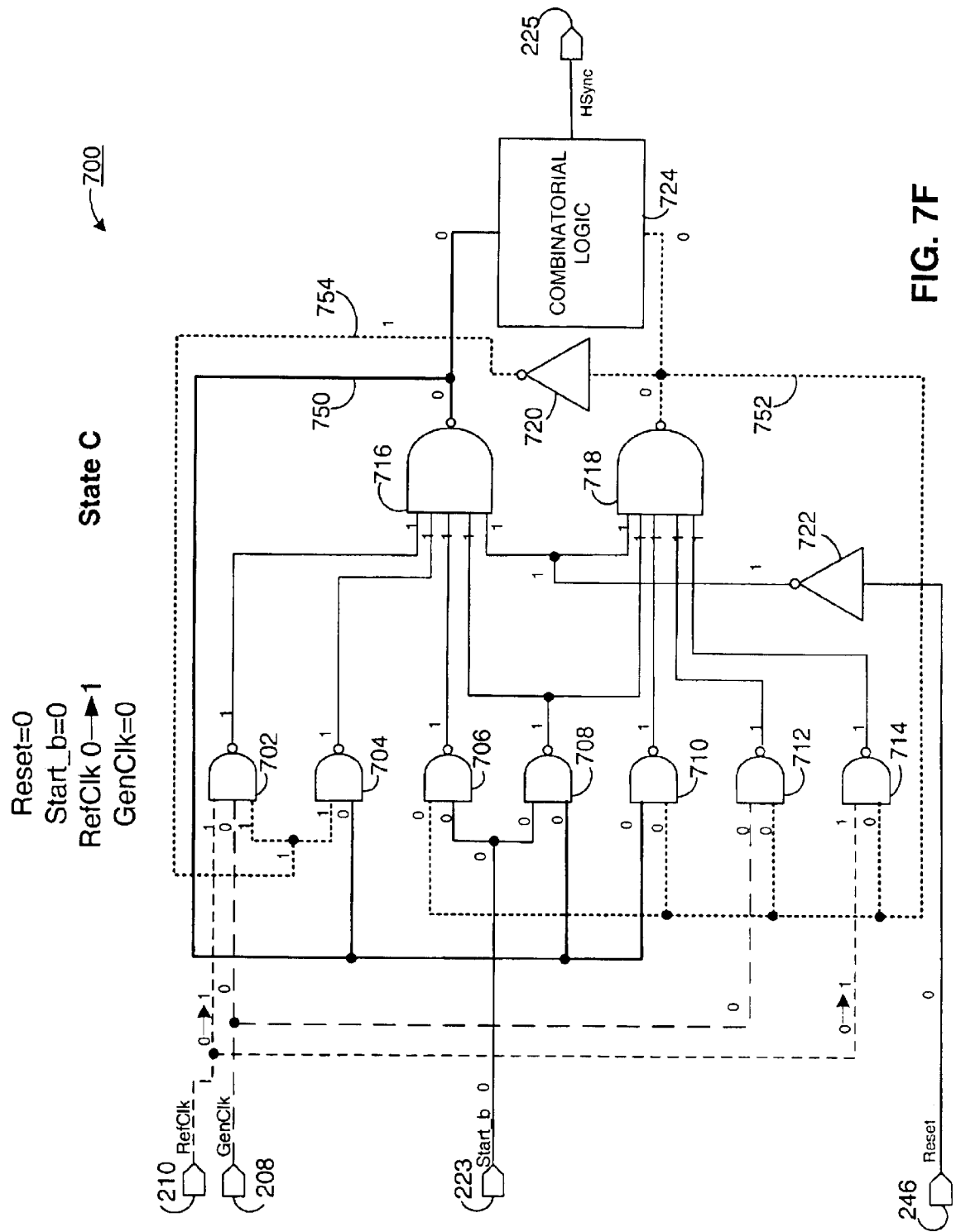

| STATES 1314 | STOP_OSC 1317 | REF_E 1318 | DIFF_OUT 1319 |
|---|---|---|---|
| BEFORE LOCK 1311 | 1 | X (FORCED 1) | 0 |
| OSCILLATOR ALIGNMENT 1312 | 0 | 0 | OSC.SIGNAL |
| HARD-PHASE ALIGNMENT 1313 | 0 | 1 | REF.EDGE |

HARD PHASE ALIGNMENT OF CLOCK SIGNALS WITH AN OSCILLATOR CONTROLLER

This is a continuation-in-part of U.S. application Ser. No. 10/300,446 filed Nov. 19, 2002, now U.S. Pat. No. 6,838,918.

FIELD OF THE INVENTION

The present invention relates generally to digital frequency synthesis and more particularly, to phase alignment of an oscillator signal to a reference clock signal for digital frequency synthesis.

BACKGROUND OF THE INVENTION

A programmable logic device (PLD) is a well-known type of integrated circuit (IC) that may be programmed by a user to perform specified logic functions. Conventionally, a PLD receives one or more external reference clock signals to generate one or more internal clock signals to operate internal digital circuits. Clock management circuits control timing of various clock signals in the PLD or other integrated circuit device.

When a clock signal propagates through an integrated circuit device, the clock signal can become skewed (delayed) so that signals in one part of the device that were generated from the skewed clock signal are out of phase with signals generated in another part of the device. Clock skew is caused by various factors, such as capacitive and resistive loading on the clock line, causing propagation delay. Clock management circuits can compensate for skewing of a clock signal as the clock signal propagates within or between IC devices.

Clock management circuits can also perform digital frequency synthesis in which a clock signal is generated whose frequency is the frequency of a reference clock signal multiplied by a rational number. For example, the generated clock signal may have a frequency 7/5 of the reference clock frequency. It is important for proper operation of circuits in the integrated circuit device that a generated clock signal be maintained accurately at the specified phase and frequency. This is often done by assuring that the phase of the generated clock signal coincide with that of the reference clock signal when concurrence should occur. For example, if the generated clock frequency is 7/5 of the reference clock frequency, then every 7 cycles of the generated clock signal and every 5 cycles of the reference clock signal, the two clock edges should be in concurrence.

Phase locked loops and delay locked loops compensate for clock skew, bringing the phase of a clock signal in one part of the device into alignment with the clock signal in another part of the device. Delay locked loops use a delay line to manage the propagation delay of the clock signals. Delay lines typically comprise a number of delay elements whose delay may be controlled by controlling, for example, a voltage or the number of delay elements. If the total delay of the delay line is controlled by adjusting the total number of delay elements on the clock path, the delay line may be referred to as a tap-controlled delay line, where taps are taken from the delay line between each of the delay elements.

Due to their relative simplicity, oscillators are sometimes constructed in integrated circuits by feeding back the output of the delay line to its input after an inversion. If the delay line in the oscillator is voltage-controlled, analog circuits adjust the frequency by adjusting the voltage applied to the delay line (voltage controlled oscillators). In an oscillator based on a tap-controlled delay line, the number of delay elements in a delay line is used to control the frequency.

Young and Bauer in U.S. Pat. No. 6,107,826; Hassoun, Goetting and Logue in U.S. Pat. No. 6,289,068; Robinson, Grung, and Chen in U.S. Pat. No. 6,356,160; and Nguyen in U.S. Pat. Nos. 6,255,880 and 6,373,308 describe clock management structures, and these patents are incorporated herein by reference. Logue, Percey, and Goetting in U.S. patent application Ser. No. 09/684,529 describe a "Synchronized Multi-Output Digital Clock Manager" that uses a delay lock loop and digital frequency synthesis for clock signal management. This patent application is also incorporated herein by reference.

Young, Logue, Percey, Goetting, and Ching in U.S. patent application Ser. No. 09/684,540 describe a "Digital Phase Shifter", also incorporated herein by reference.

Logue in U.S. Pat. No. 6,384,647 describes a "Digital Clock Multiplier and Divider with Synchronization During Concurrences", also incorporated herein by reference. FIG. 3b of that patent is presented here as FIG. 1.

FIG. 1 herein shows the effect of hard phase alignment. A clock output signal C_O_CLK is generated from a reference clock signal REF_CLK. This generated clock signal C_O_CLK has approximately the desired frequency. In the example of FIG. 1, REF_CLK has a period of 50 units of time. The generated clock signal is four times as fast as the reference clock signal and thus should have a period of 12.50 units of time. But the generated clock signal C_O_CLK actually has a period of only 12 units of time. Therefore C_O_CLK becomes out of phase with REF_CLK. Thus, in a window W when concurrence should occur, instead of continuing to generate C_O_CLK, the generated clock signal is adjusted using the edge of REF_CLK, so C_O_CLK is again synchronized with REF_CLK. This method of synchronizing to the REF_CLK signal is called hard phase alignment.

A phenomenon called jitter randomly causes clock edges to become advanced or retarded. Jitter occurs even to the reference clock signal. Thus, it is difficult to align a generated clock signal to a reference clock signal when both have jitter. If a window is used, and jitter places an edge beyond the window, the clock management circuit may be unable to maintain the synchronization of a generated clock signal to a reference clock signal.

In an IC such as an FPGA in which a wide range of clock frequencies must be offered, the window must be a different size for different user-selected operating frequencies. Typically, the user must specify the window placement during programming of the FPGA. Also, if it is desired to make all generated clock pulses of nearly equal width (reduce jitter), it is necessary to provide a wide range of delays in order to better adjust the generated clock signal continuously, which requires enough chip area to accommodate many delay circuits. Still, the window for alignment must be pre-calculated, and if jitter is too great, the reference clock edge will not arrive during the window, and alignment will not occur. In one circuit, the generated clock signal stopped oscillating in the presence of high jitter, an unacceptable result. Thus there is a need for a phase alignment circuit and method that generates a reliable clock signal in the presence of high jitter and high clock skew. It would be desirable, also, to achieve this result in a small chip area. It is also desirable that the phase alignment circuit contribute a small amount of internal IC noise due to its own switching.

SUMMARY OF THE INVENTION

An aspect of the invention is an oscillator controller in an integrated circuit, comprising: differential logic for receiving a differential clock input and a differential oscillator input, the differential clock input associated with a clock signal, the differential oscillator input associated with an oscillator signal, the clock signal and the oscillator signal having different frequencies; the differential logic configured to provide a differential output at least partially responsive to at least one of the clock signal and the oscillator signal; and control logic for receiving control signals, the control logic configured to put the differential logic in one of three states in response to the control signals, the three states including a first state for propagating by the differential logic an edge of the clock signal to the differential output for a hard-phase alignment.

Another aspect of the invention is an oscillator controller in an integrated circuit, comprising: differential logic for receiving a differential clock input and a differential oscillator input, the differential clock input associated with a clock signal, the differential oscillator input associated with an oscillator signal, the clock signal and the oscillator signal having different frequencies; the differential logic configured to provide a differential output at least partially responsive to at least one of the clock signal and the oscillator signal; the differential logic configured to provide a combinational circuit in an oscillator alignment state and to provide a sequential circuit in a hard-phase alignment state; and control logic for receiving control signals, the control logic in part to selectively alternate between putting the differential logic in the oscillator alignment state and in the hard-phase alignment state responsive to the control signals.

BRIEF DESCRIPTION OF THE DRAWINGS

FIGS. 7A through 7H show signal values at nodes in the circuit of FIG. 7 for different states of the state machine.

DETAILED DESCRIPTION OF THE DRAWINGS

Figure 2:
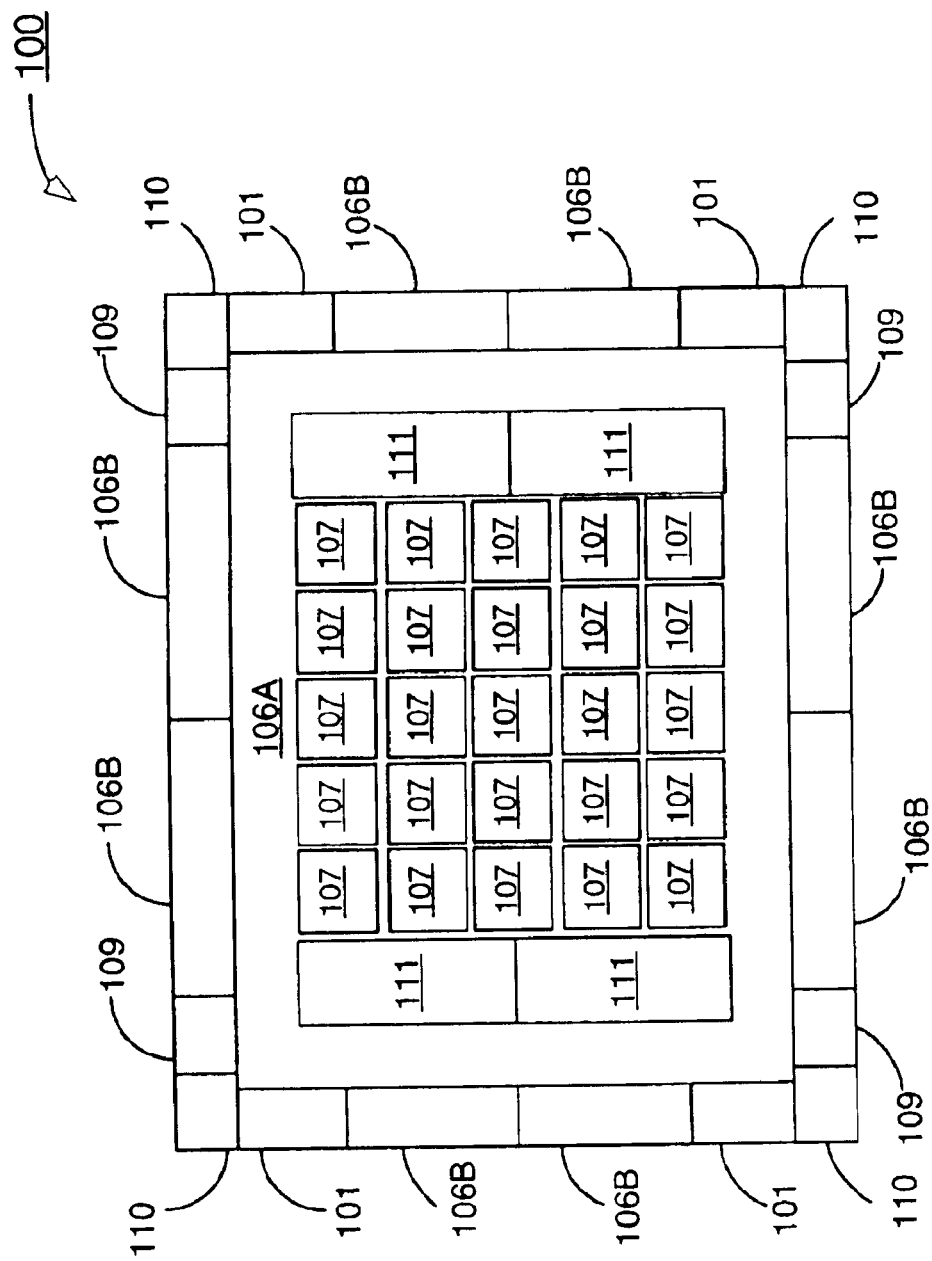
FIG. 2 is a block diagram of an FPGA that implements the present invention.

FIG. 2 shows FPGA 100, which includes CLBs 107, I/O routing ring 106A, memory 111, delay lock loops (DLLs) 109, multiply/divide/de-skew clock circuits 110, and programmable input/output blocks (IOBs) 106B. DLLs 109 and multiply/divide/de-skew clock circuits 110 collectively implement digital clock management circuits (DCMs). FPGA 100 also includes frequency synthesis circuits 101. Such an FPGA can implement the present invention. FPGA 100 benefits from the phase synchronizer of the present invention by generating a clock signal of a frequency selected by a user and reliably synchronized to a reference clock signal, typically having a frequency different from that selected by a user.

Figure 3:
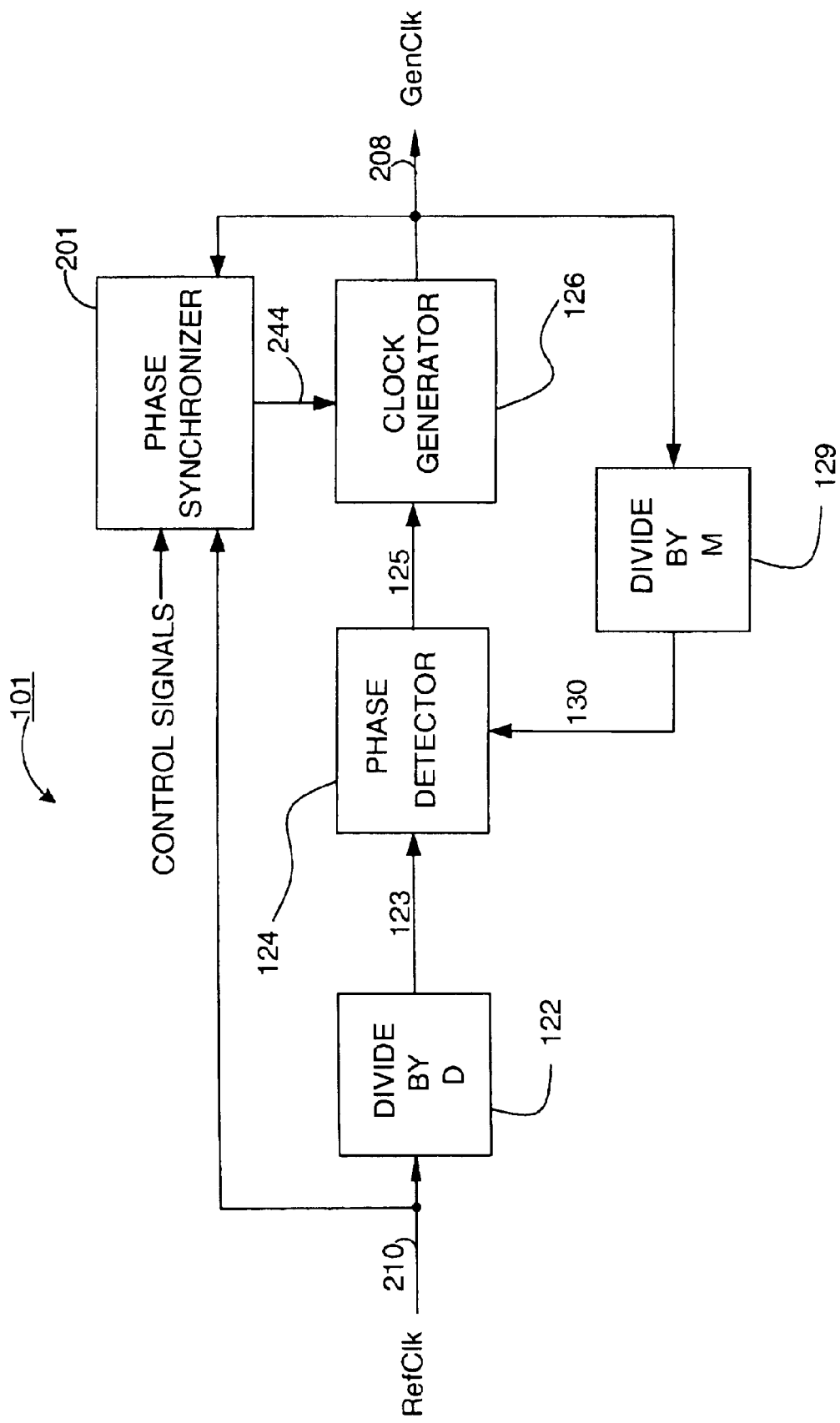
FIG. 3 shows a frequency synthesis circuit where the present invention may be used.

FIG. 3 shows a block diagram of a circuit for generating a generated clock signal GenClk having a ratio M/D to a reference input clock signal RefClk. The generated clock signal GenClk is generated by clock generator 126 in response to a phase detector 124 and a phase synchronizer 201. In order to generate the desired clock frequency GenClk, reference clock signal RefClk on line 210 is applied to Divide-by-D circuit 122. Well known circuits can be used to perform this divide function. An output signal 123 of Divide-by-D circuit 122 is received by phase detector 124 which also receives a divide-by-M signal on line 130 and causes clock generator 126 to generate an output signal GenClk that is M/D times RefClk.

Phase detector 124 provides a phase detection signal on line 125 to clock generator circuit 126, which generates clock signal GenClk on line 208. This output signal GenClk is applied to Divide-by-M circuit 129, which generates a divided signal applied on line 130 to phase detector 124. Phase detector 124 compares its two input signals on lines 123 and 130 and applies a signal on line 125 that guides clock generator 126 to adjust the frequency of the generated clock signal GenClk toward the desired frequency. The desired frequency can be achieved by feeding back a delayed clock signal from clock generator 126 through an inverter to phase synchronizer 201 to form an oscillator. The amount of delay determines the frequency of the oscillator. When the frequency is not quite right, it is adjusted by modifying the taps in the direction dictated by the phase detector 124. Phase detector 124 is discussed in detail in connection with FIGS. 9–12 below.

In one embodiment, clock generator 126 is a tapped delay line having 256 serially arranged coarse delay elements from which an intermediate signal may be tapped and eight parallel fine delay elements into which the intermediate signal may be applied. The GenClk signal of the clock generator on line 208 is taken from the output of one of the fine delay elements. An oscillator is formed by inverting and feeding the GenClk signal on line 208 back through phase synchronizer 201. The oscillator frequency is determined by the selected taps in the clock generator 126, but even with coarse and fine selection of the delays, the clock generator will not maintain a precise frequency without some correction.

Clock generator 126 may be formed as described by Logue in U.S. Pat. No. 6,384,647. FIG. 2a of that patent shows a structure having an initialization circuit 250, a halt/restart circuit 245, an oscillator control circuit 260, and a variable digital oscillator 270. These structures are described in detail by Logue, and may be used to implement clock generator 126 described here.

Clock generator 126 is controlled by both phase detector 125 and phase synchronizer 201. Phase synchronizer 201 periodically replaces the generated clock signal GenClk as it oscillates through phase synchronizer 201 with the reference clock signal RefClk received on line 210, in order to perform hard phase alignment.

Phase synchronizer 201 will now be discussed in detail.

Figure 4:
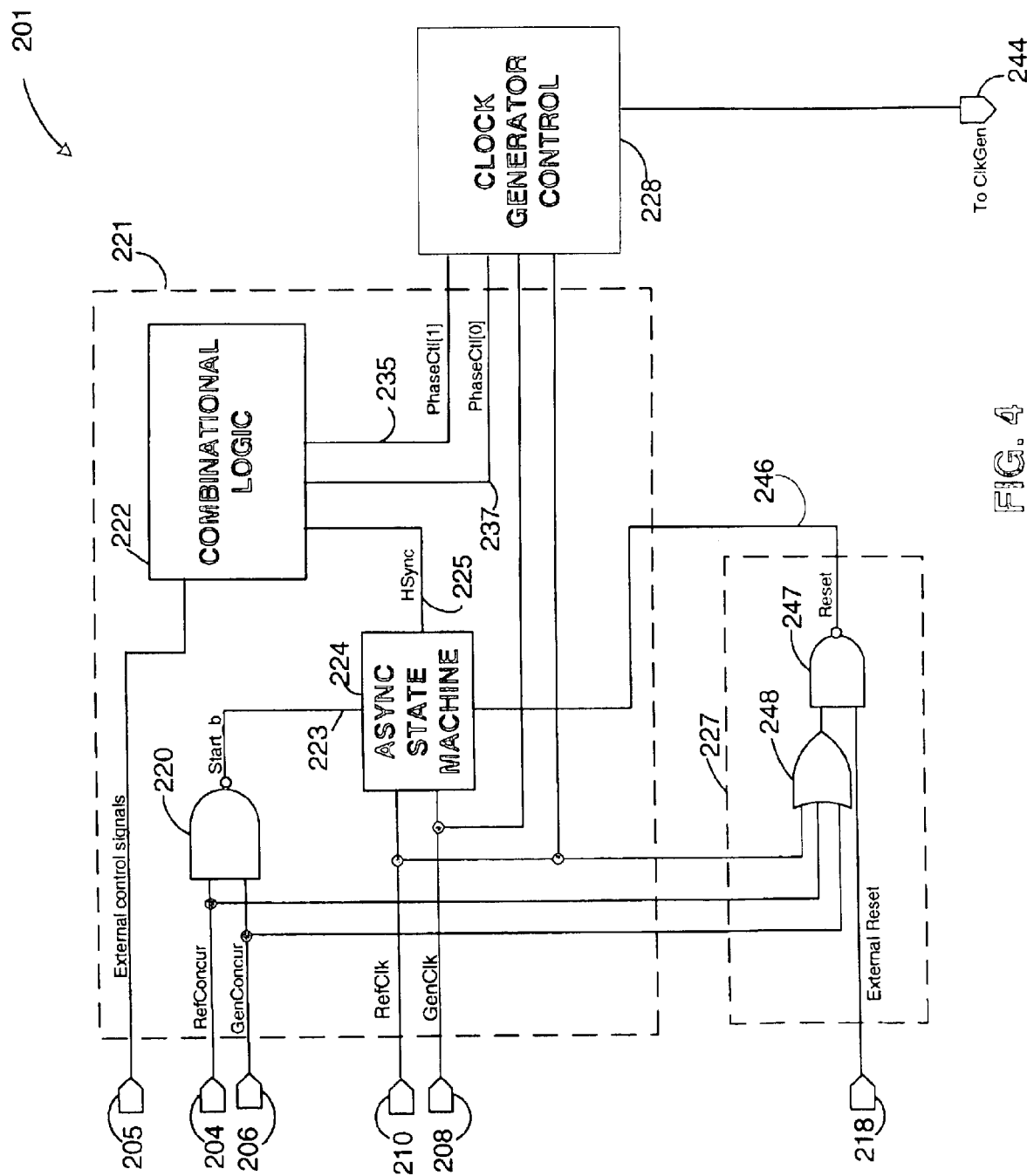
FIG. 4 shows a phase synchronizer circuit according to the present invention.

FIG. 4 shows an embodiment of phase synchronizer 201.

In addition to receiving the reference clock signal RefClk on line 210 and the generated clock signal GenClk on line 208, phase synchronizer 201 also receives counter output signals RefConcur on line 204 and GenConcur on line 206 indicating when the reference and generated signals have oscillated D and M times respectively, which is when the RefClk and GenClk signals, should be in concurrence. Phase synchronizer 201 also receives a global external reset signal on line 218 and other external control signals on lines 205.

The Start_b signal becomes active (in this embodiment, goes low) when both RefClk and GenClk have cycled enough times, and initiates the hard phase alignment process of asynchronous state machine 224.

Circuit 227 generates a high internal reset signal on line 246 either when the external reset signal goes low, or when OR gate 248 indicates that both RefConcur and GenConcur have gone low and that RefClk has also gone low. This internal reset signal assures that asynchronous state machine 224 begins in its initial state before each concurrence cycle. In another embodiment, circuit 227 can be omitted; nevertheless, circuit 227 increases the reliability of the state machine 224 in the presence of excessive noise.

Asynchronous state machine 224 generates the hard synchronization signal HSync on line 225. This HSync signal may be applied directly as a phase control signal to clock generator control circuit 228 or modified as shown in FIG. 4 by combinational logic 222 to generate phase control signals only under conditions controlled by external control signals on lines 205. For example, combinational logic 222 may comprise gates for generating PhaseCtl [1] and PhaseCtl [0] as functions of HSync on line 225, a halt signal, and other control signals specific to one embodiment of the invention. In this embodiment PhaseCtl [1] may simply be the inverse of the halt signal, and only asserted before the phase synthesizer 201 is tracking the phase or locked. PhaseCtl [1] may be the AND of the reference clock and PhaseCtl [1] before tracking the phase has started and may be the same as HSync after the system is tracking the phase or locked. Clock generator control circuit 228 generates the clock generator control signal on line 244 that is applied to clock generator 126 of FIG. 3 to control hard phase alignment. Asynchronous state machine 224 achieves the improvement over prior art structures such as that described by Logue in U.S. Pat. No. 6,384,647 by using an internally generated start signal to activate the alignment window. The start signal avoids having a pre-set window for hard phase alignment.

Figure 5:
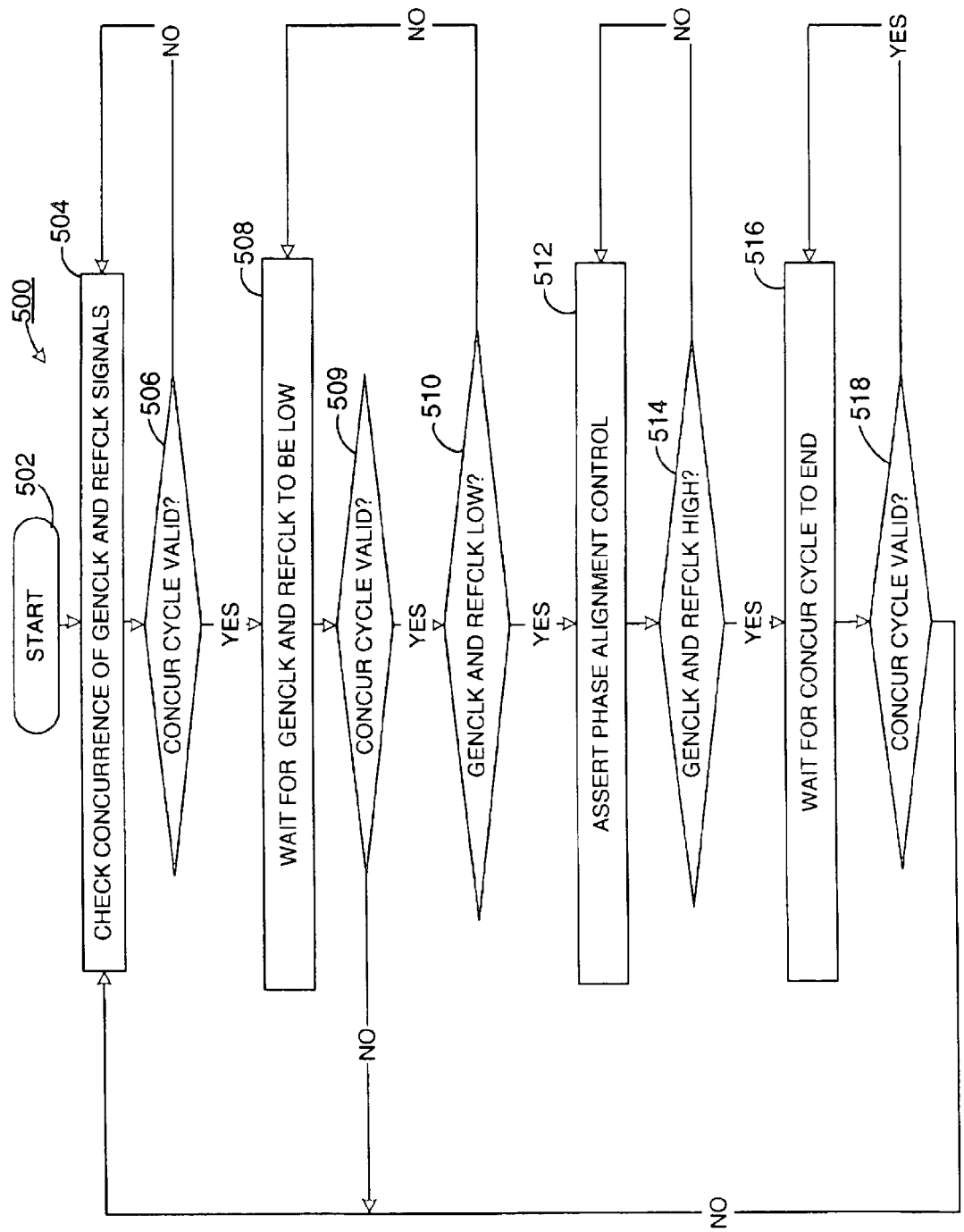
FIG. 5 is a flow diagram showing the operation of an asynchronous level-mode state machine used in the circuit of FIG. 4.

FIG. 5 shows a flow chart implemented by asynchronous state machine 224. Phase alignment method 500 moves to step 502 in response to a valid (active) Start_b signal. At 504, concurrence of generated clock signal 208 and reference clock signal 210 is checked. At 506, if concurrence is not present, then phase alignment method 500 returns to 504. However if at 506, concurrence is present (RefClk and GenClk have the same logic value), then at 508 phase alignment method 500 waits for generated clock signal 208 and reference clock signal 210 to be logic low. At 509, concurrence between generated clock signal 208 and reference clock signal 210 is again checked. If at 509 generated clock signal 208 and reference clock signal 210 are not in concurrence, then phase alignment method 500 returns to 504. If however at 509, generated clock signal 208 and reference clock signal 210 are in concurrence, the method continues to 510. If at 510, generated clock signal 208 and reference clock signal 210 are not both logic low, then phase alignment method 500 returns to 508. If however at 510 generated clock signal 208 and reference clock signal 210 are both logic low, then at 512, phase alignment method 500 asserts the phase alignment control signal, e.g., phase alignment signal 225 (see FIGS. 3 and 4), to hard phase align the generated clock signal on line 208 to the reference clock signal on line 210. This alignment occurs as the reference clock signal RefClk on line 210 goes high. At 514, logic levels of generated clock signal 208 and reference clock signal 210 are compared. If at 514, generated clock signal GenClk on 208 and reference clock signal RefClk on 210 are not both logic high, then phase alignment method 500 returns to 512. However, if generated clock signal 208 and reference clock signal 210 are both logic high, then at step 516 phase alignment method 500 waits for concurrence between generated clock signal 208 and reference clock signal 210 to end. If at 518, the Start_b signal is still active, then method 500 returns to 516. However, if at 518 the Start_b signal becomes inactive indicating concurrence of generated clock signal 208 and reference clock signal 210 is ended, then phase alignment method 500 returns to 504 and waits for the next concurrence.

Figure 6:
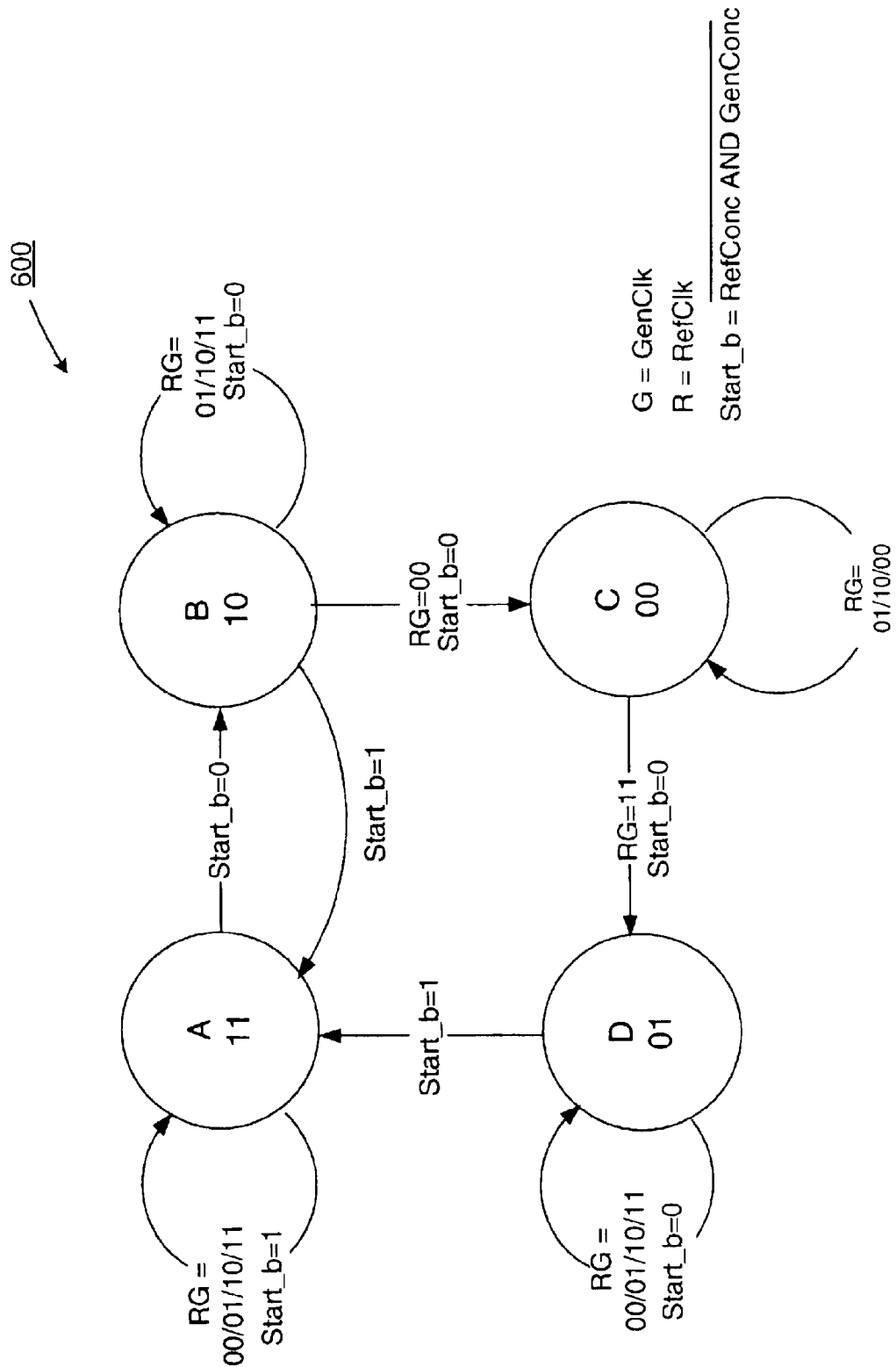
FIG. 6 shows a state diagram for the asynchronous level-mode state machine used in the circuit of FIG. 4.

FIG. 6 shows a state diagram for the asynchronous state machine 224 of FIG. 4 or FIG. 5. The state machine has four states A, B, C, and D. State A occurs when RefClk and GenClk are not expected to be in concurrence. In state A, the Start_b signal is inactive (logic high in this embodiment). When Start_b goes low, the state machine moves to state B, where the states of RefClk and GenClk are checked. In FIG. 6, R stands for RefClk and G stands for GenClk. As shown in FIG. 6, as long as either of RefClk or GenClk are logic I (high) and the Start_b signal remains active (logic 0), the state machine waits in state B. When both RefClk and GenClk go low, if Start_b is still active (low), the state machine moves to state C, where hard phase alignment is performed. This alignment occurs when the edge of RefClk goes high.

When both of RefClk and GenClk have gone high (which means hard phase alignment has been achieved successfully), the state machine moves to state D, where it remains until the Start_b signal goes inactive (high) indicating concurrence is ended. State machine 600 then returns to state A to wait for another concurrence between edges of RefClk and GenClk, at which time hard phase alignment is repeated.

Figure 7:
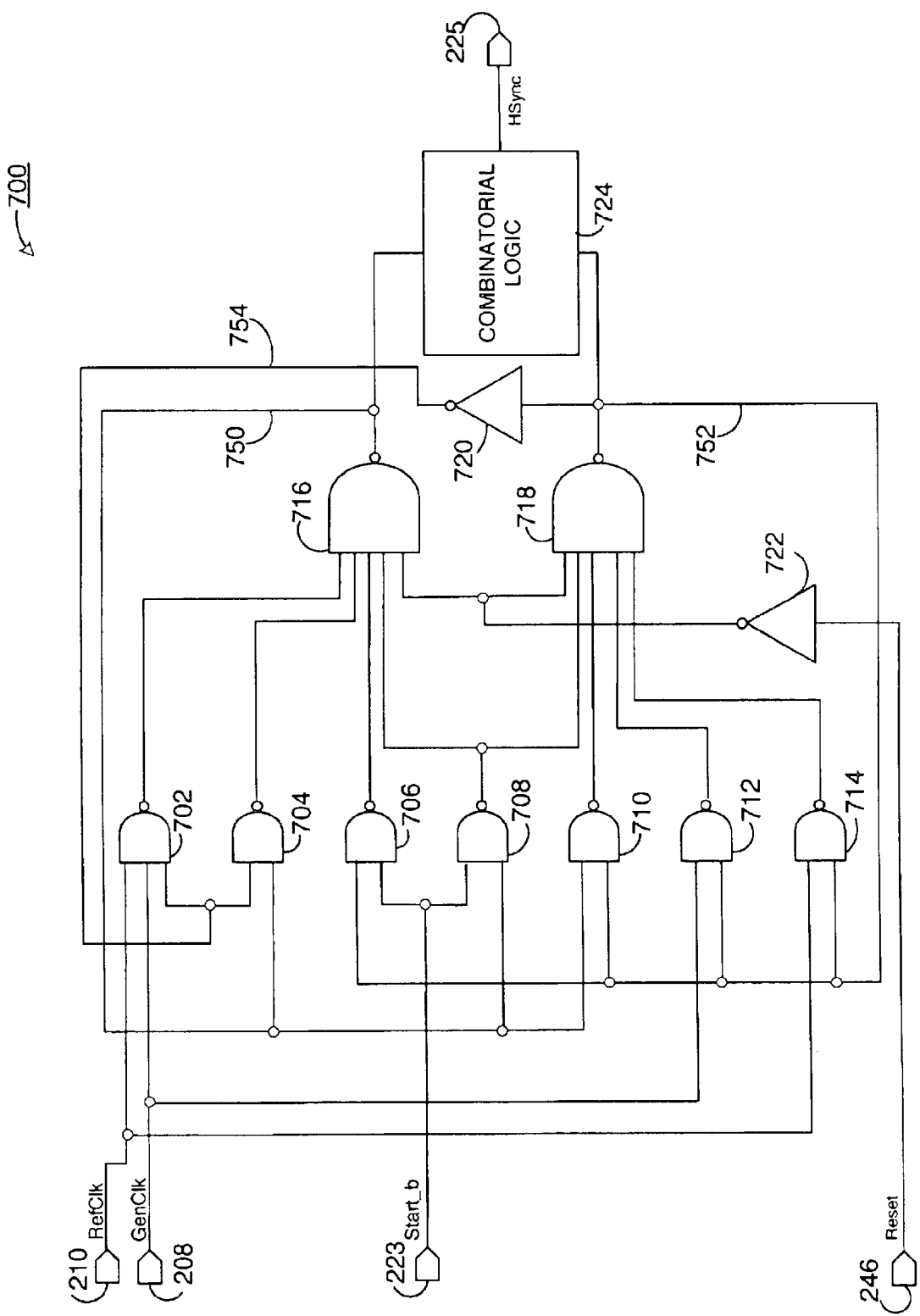
FIG. 7 shows an exemplary circuit diagram for the asynchronous level-mode state machine used in the circuit of FIG. 3.

FIG. 7 shows a circuit that can implement the flow of FIG. 5 or the state machine of FIG. 6. The circuit of FIG. 7 uses NAND gates. As will be understood by one of ordinary skill in the art, many other circuits can also implement the state machine of FIGS. 5 and 6, using AND gates, OR gates, or a combination of gates, as long as the intended asynchronous logic is implemented whereby hard phase alignment occurs when concurrence is expected and the logic level and clock edge of the reference signal are appropriate for replacing the logic level and clock edge of the generated clock signal.

The circuit of FIG. 7 includes two feedback paths and thus implements a storage circuit having four possible states with four combinations of two output signals. This circuit receives four input signals, an optional global Reset signal, the Start_b signal, the RefClk signal, and the GenClk signal. Eight versions of FIG. 7, labeled 7A–7H are presented, with values on lines of the circuit for showing the operation of this circuit.

Figure 7A:
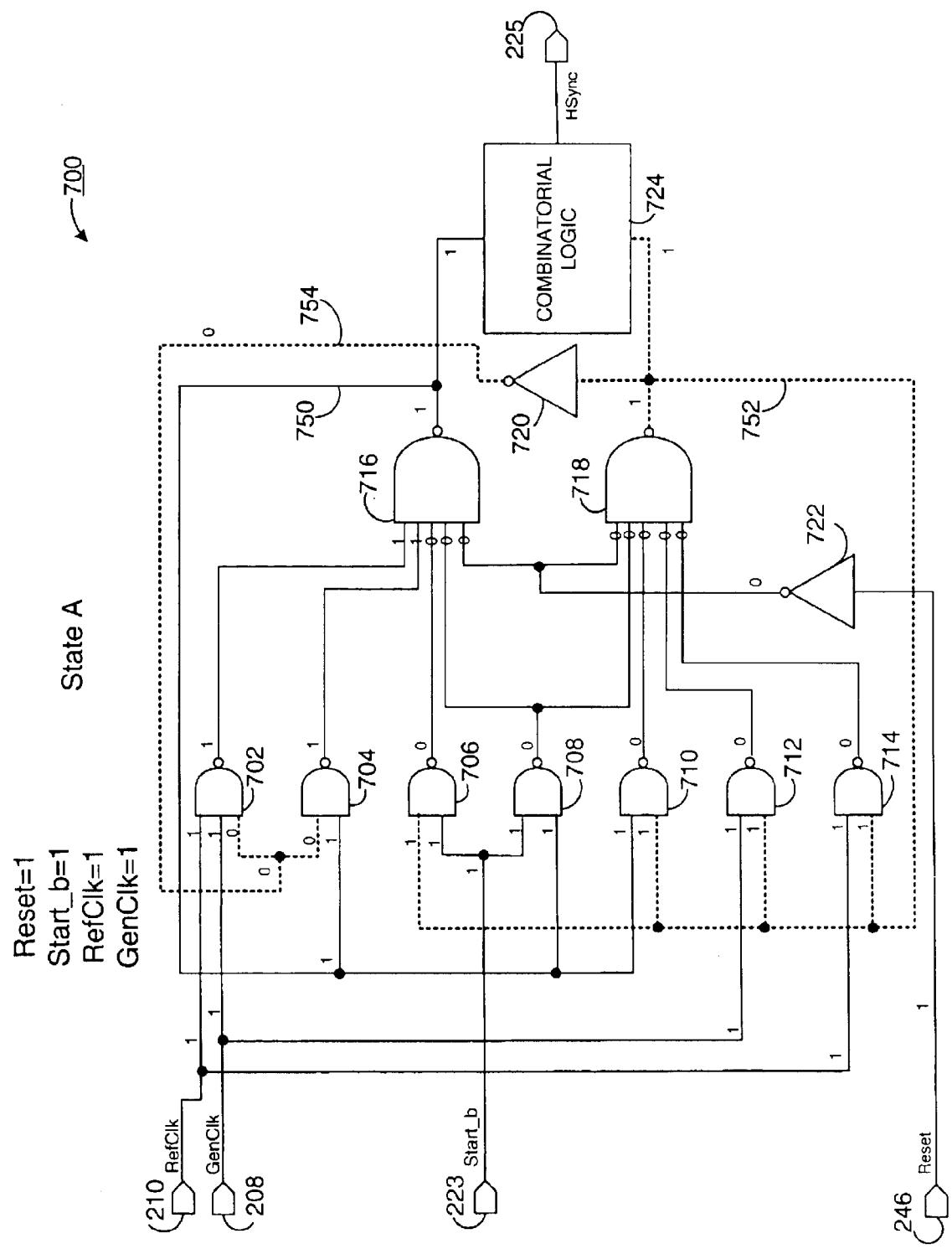

In FIG. 7A, the Reset signal is active, causing NAND gates 716 and 718 to provide logic 1 output signals regardless of the states of other input signals. Combinational logic circuit 724 receives two logic 1 input signals and therefore does not provide an active HSync output signal on line 225. In one embodiment the circuit 724 can be a simple 2-input NAND gate.

Figure 7B:
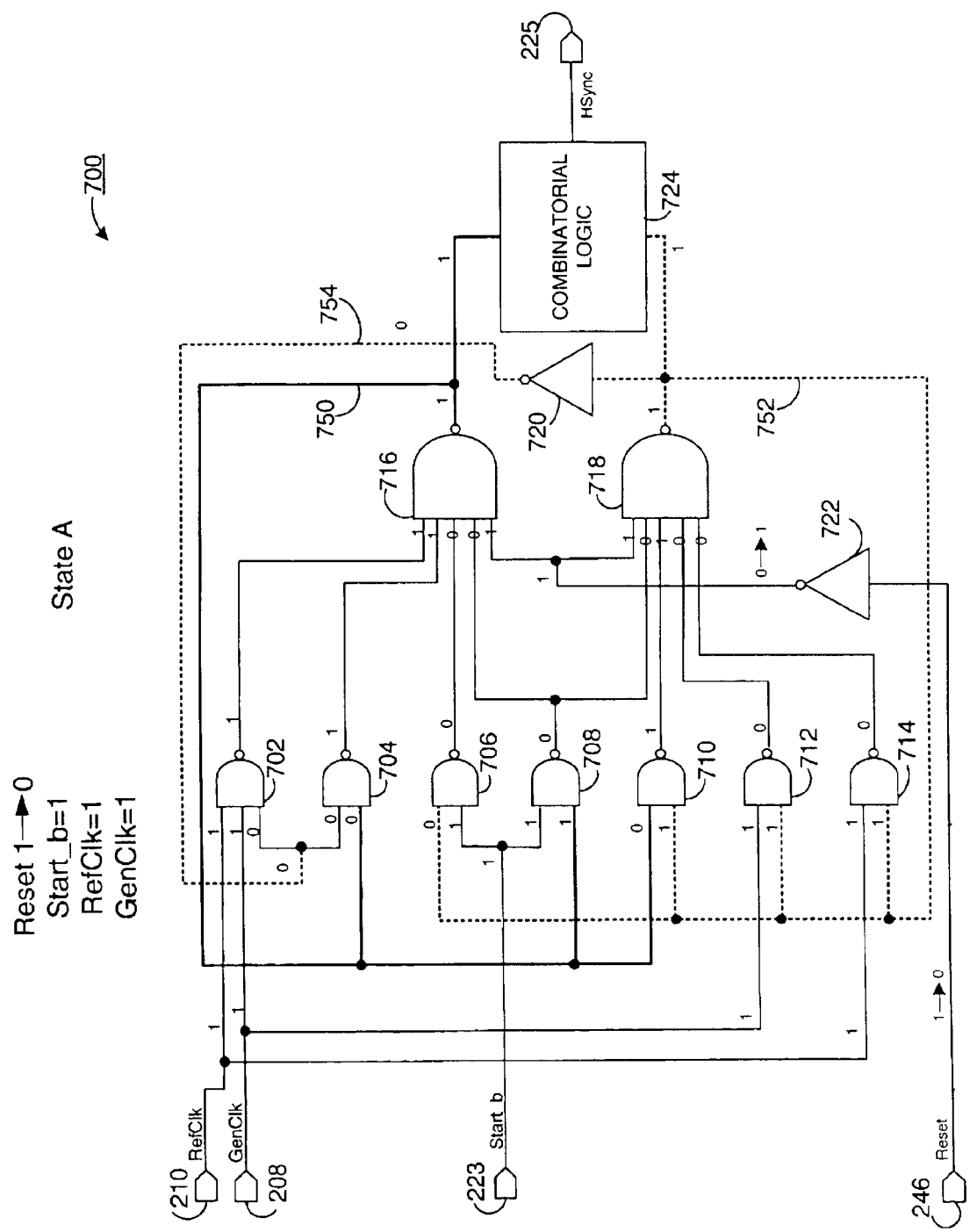

FIG. 7B shows a situation in which Reset has gone inactive (low) and the Start_b signal is still inactive. NAND gate 716 receives low input signals from NAND gates 706 and 708 (controlled by the Start_sb ignal) and thus continues to provide a logic 1 output signal. NAND gate 718 also receives a low input signal from NAND gate 708 and in this example also from NAND gates 712 and 714 which in the example of FIG. 7B reflect the high signals from RefClk and GenClk. Therefore, NAND gate 718 provides a logic 1 output signal. Thus, circuit 724 again receives two logic 1 input signals and does not provide an active HSync output signal on line 225.

Figure 7C:
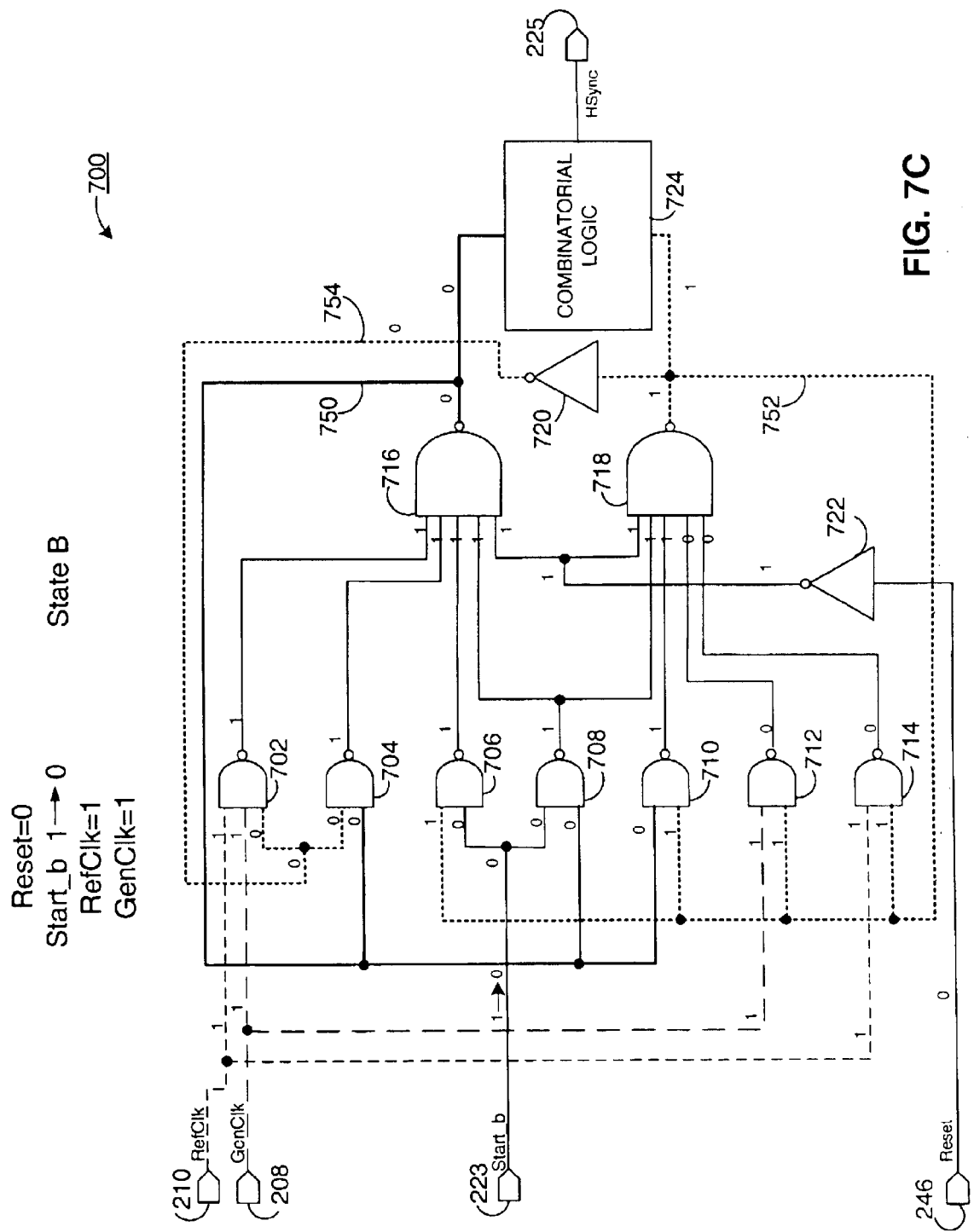

In FIG. 7C, the Start_b signal has become active (low). This causes NAND gates 706 and 708 to provide high output signals. Since NAND gate 718 continues to receive low signals from NAND gates 712 and 714 due to the high RefClk and GenClk signals, NAND gate 718 continues to provide a high output signal. But since NAND gate 716 now receives all high input signals, NAND gate 716 provides a low signal to circuit 724. If combinatorial logic circuit 724 is a NAND gate, it continues not providing an active HSync output signal on line 225.

Figure 7D:
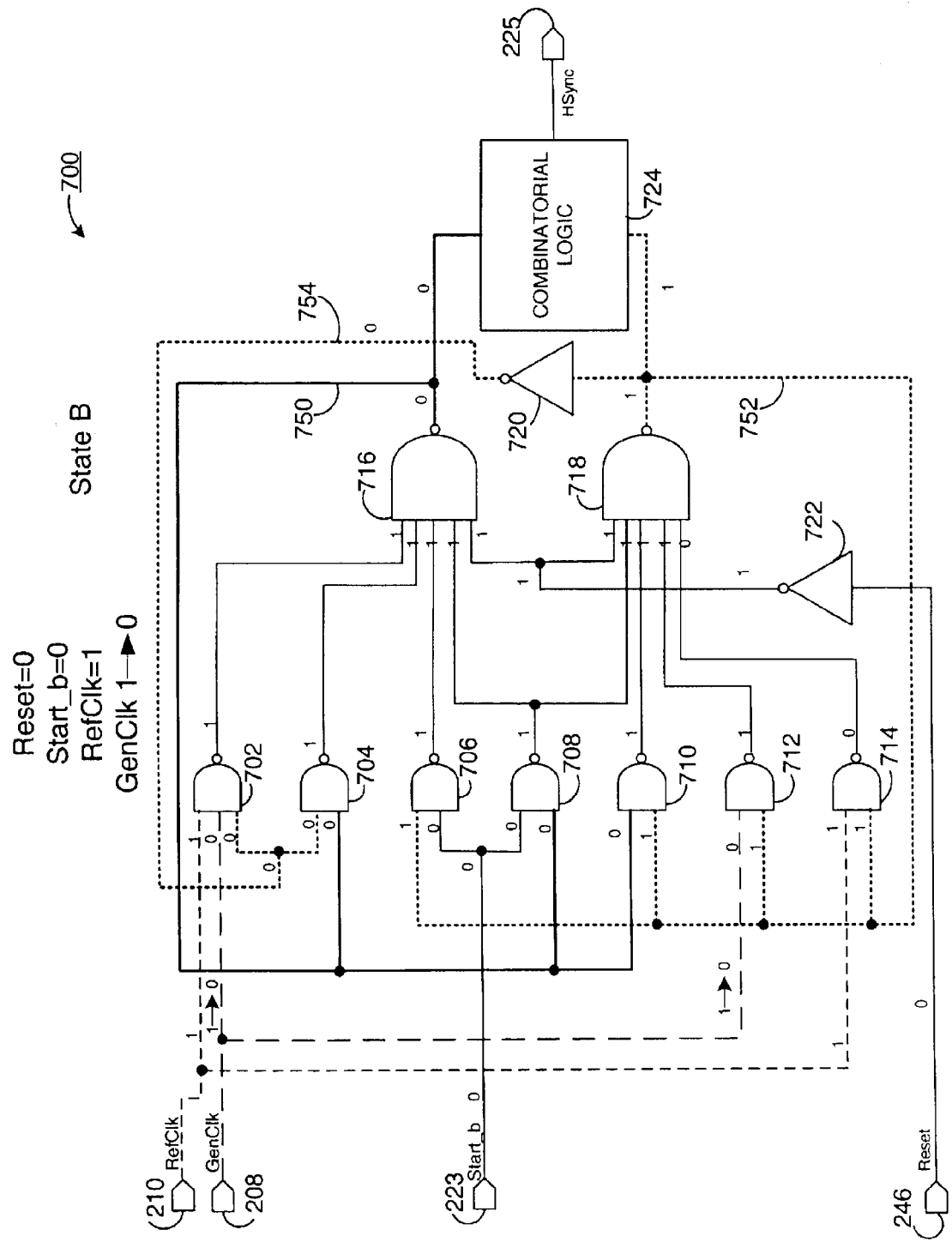

In FIG. 7D, the GenClk signal goes low but RefClk remains high. This causes NAND gate 712 to output a high signal to NAND gate 718 but does not change the state of NAND gate 718 because NAND gate 714 is still providing a low input signal. Thus the state machine remains in State B and combinatorial circuit 724 continues not providing an active HSync output signal on line 225.

Figure 7E:
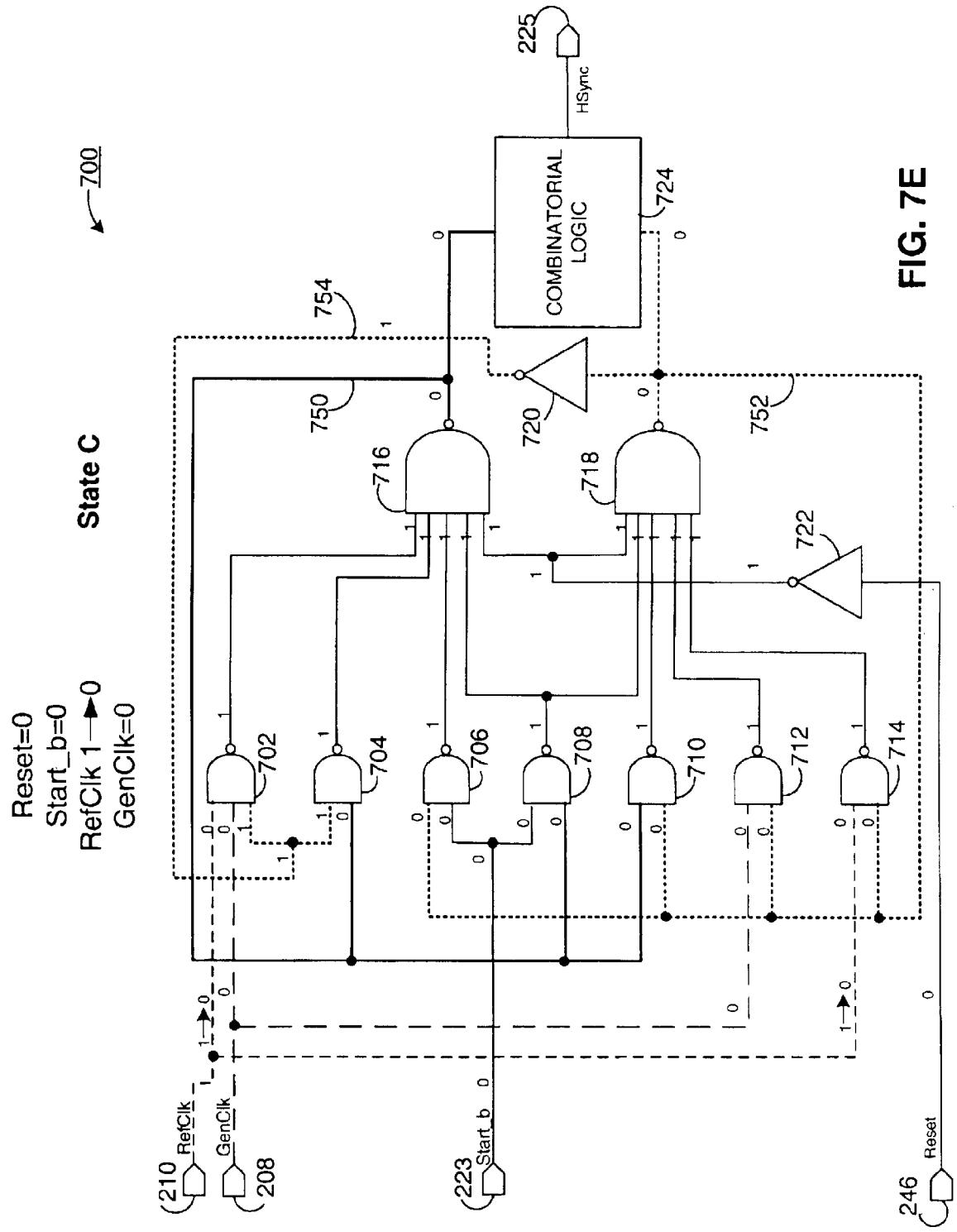

In FIG. 7E, the RefClk signal goes low. This does not change the output of NAND gate 702 so all inputs to NAND gate 716 remain high and NAND gate 716 continues to output a logic 0 to combinatorial logic circuit 724. But NAND gate 714 now provides a high signal to NAND gate 718 so NAND gate 718 outputs a low signal to combinatorial logic circuit 724. If combinatorial circuit 724 is a NAND gate, the two low input signals cause circuit 724 to output an active HSync output signal on line 225.

In FIG. 7F, RefClk again goes high, but this does not change the state of NAND gate 714 or NAND gate 702. So NAND gates 716 and 718 continue to output logic 0, and HSync remains active.

Figure 7G:
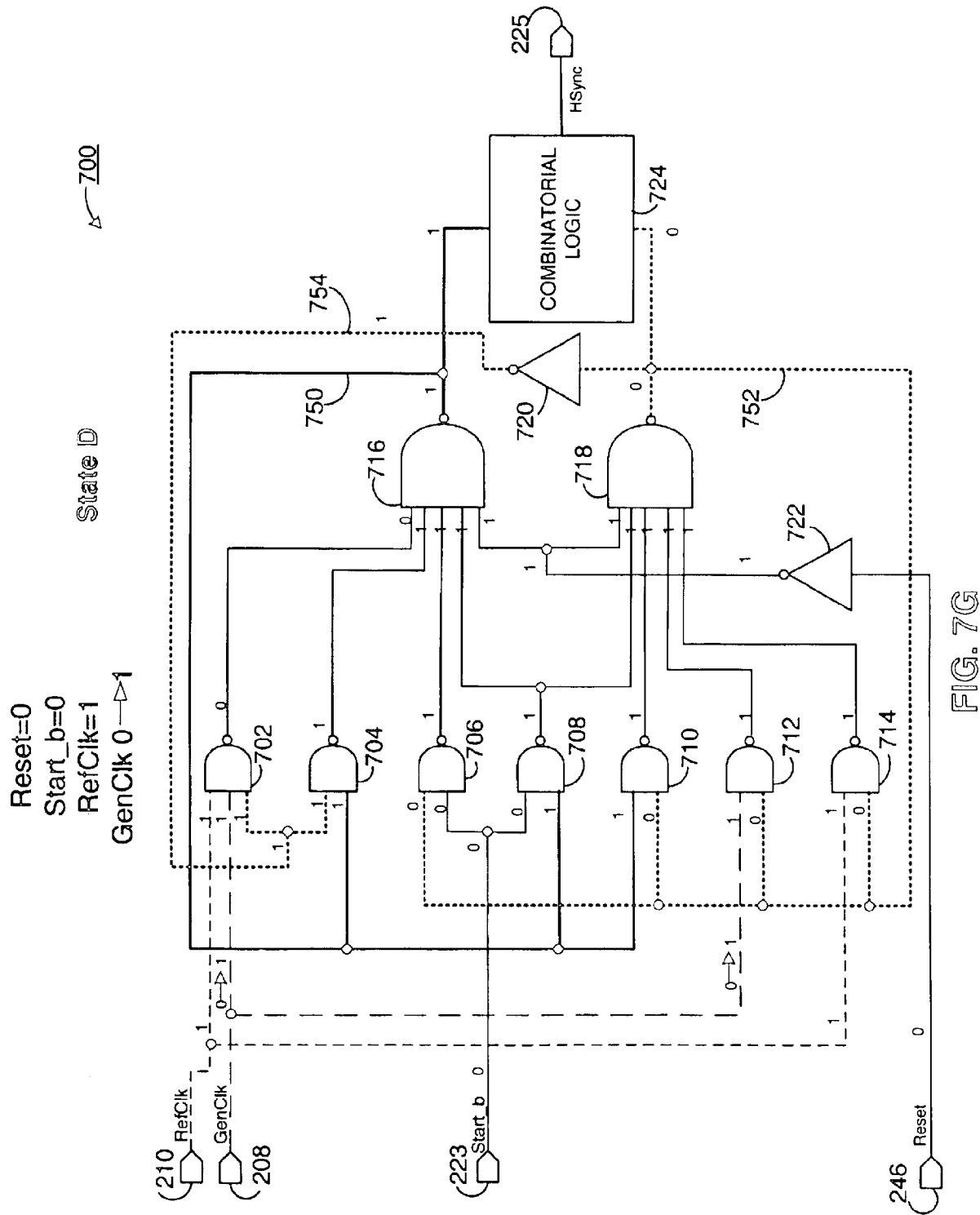

In FIG. 7G, GenClk also goes high, so NAND gate 712 outputs a logic 1, causing NAND gate 718 to output a logic 0, and causing combinatorial logic circuit 724 to no longer output, an active HSync output signal on line 225.

Figure 7H:
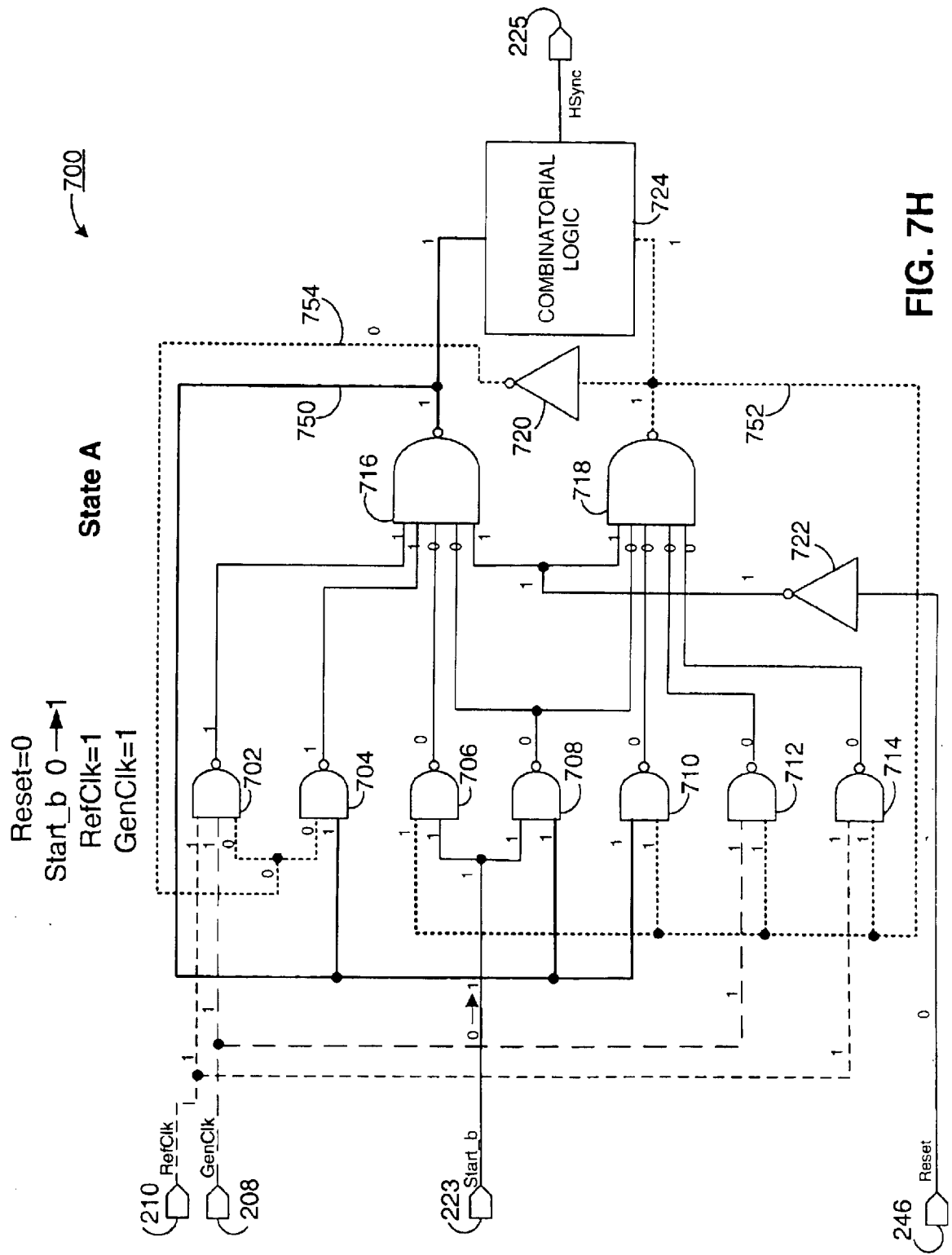

Finally, in FIG. 7H, Start_b goes high, causing both NAND gates 716 and 718 to output logic 1, returning the state machine to State A, ready for the next concurrence cycle.

The circuit of FIG. 7 is only one of many circuits that can implement the asynchronous state machine that accomplishes the invention. Any circuit that makes use of a start signal based on a counter, detects concurrence, and instructs another circuit to replace a generated clock signal with a reference clock signal can implement the invention. Many combinations of logic gates can accomplish this purpose, not just the NAND gate circuit shown in FIG. 7.

As shown in FIG. 4, the HSync output signal on line 225 is applied to combinational logic circuit 222. Combinational logic circuit 222 controls clock generator control circuit 228. Combinational logic circuit 222 provides two phase control signals to clock generator control circuit 228. One of them, phaseCtl [1] on line 235 is used only when clock generator 126 has not yet started to track the phase of the reference clock signal RefClk. However, the other phase control signal phaseCtl [0] on line 237 determines when hard phase alignment takes place. This signal is derived from the HSync signal on line 225 by combinational logic circuit 222. If external control signals on lines 205 indicate that the clock generator 126 should track the phase or is locked, then combinational logic circuit 222 passes the HSync signal as the PhaseCtl [0] signal on line 237. This causes clock generator control circuit 228 to substitute the edge of reference clock signal RefClk for that of the generated clock signal GenClk at the expected concurrence so hard phase alignment is achieved.

Figure 8:
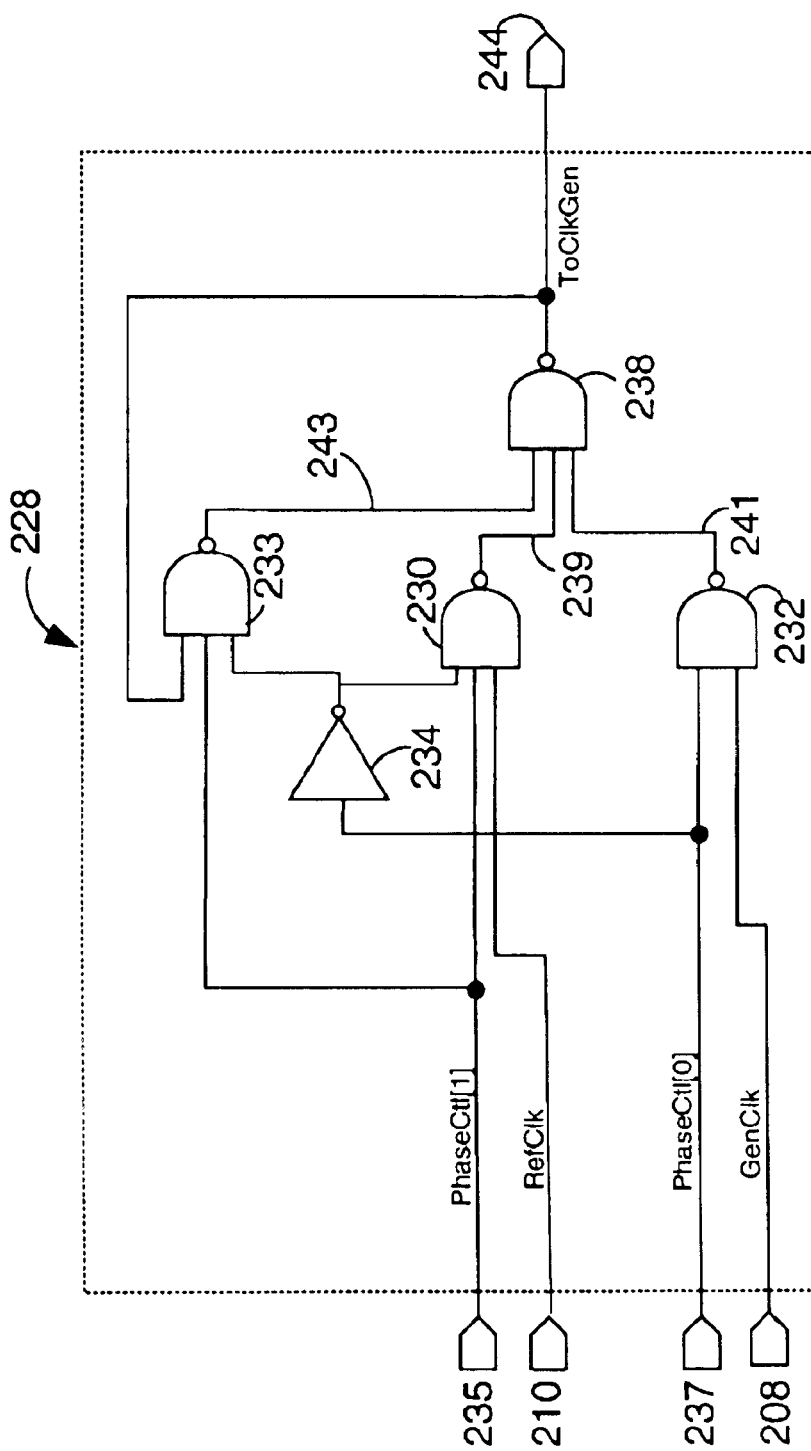
FIG. 8 shows a clock generator control circuit that can be used in the phase synchronizer circuit of FIG. 4.

FIG. 8 shows an embodiment of clock generator control circuit 228. It can be seen that when PhaseCtl [1] on line 235 is low, NAND gates 233 and 230 output logic 1 signals to NAND gate 238 so that NAND gate 238 simply inverts the signal from NAND gate 232. If PhaseCtl [0] on line 237 is low, then NAND gate 241 provides a high output signal and the output signal from clock generator control circuit 228 is low regardless of the state of the generated clock signal GenClk on line 208. Thus the clock generator 126 and phase alignment from phase synchronizer 201 (FIG. 3) are disabled.

Returning to FIG. 8, we may observe that after locking and phase tracking have started, PhaseCtl [1] on line 235 stays logic high, and the influence of RefClk and GenClk is determined by PhaseCtl [0].

When PhaseCtl [0] is low, RefClk will be selected as follows. NAND gate 232 outputs a logic high on line 241. Inverter 234 applies high input signals to NAND gates 230 and 233, enabling NAND gate 230. When a high RefClk causes the output of NAND gate 230 to go low, NAND gate 238 generates a high output signal on line 244. This high output signal is fed back to NAND gate 233. Thus, NAND gate 233 generates a low output signal, which duplicates the low output signal from NAND gate 230. When RefClk goes low (the end of concurrence), the high output signal from NAND gate 230 does not cause NAND gate 238 to switch because line 243 is still low. Thus only a single clock edge is generated by clock generator control circuit 228 in response to the high going RefClk signal following a low-going PhaseCtl [0] signal.

The effect of phase synchronizer 201 (FIG. 3) is thus to provide a hard phase alignment to the rising edge of the RefClk signal during the cycle at which concurrence is expected. The window of time during which hard phase alignment occurs depends on the jitter at the time and not on some pre-set or pre-programmed window estimate. Other circuits can achieve this one-time signal generation, as will be understood by those of ordinary skill in the art.

Phase detector 124 will now be described in detail.

Figure 9:
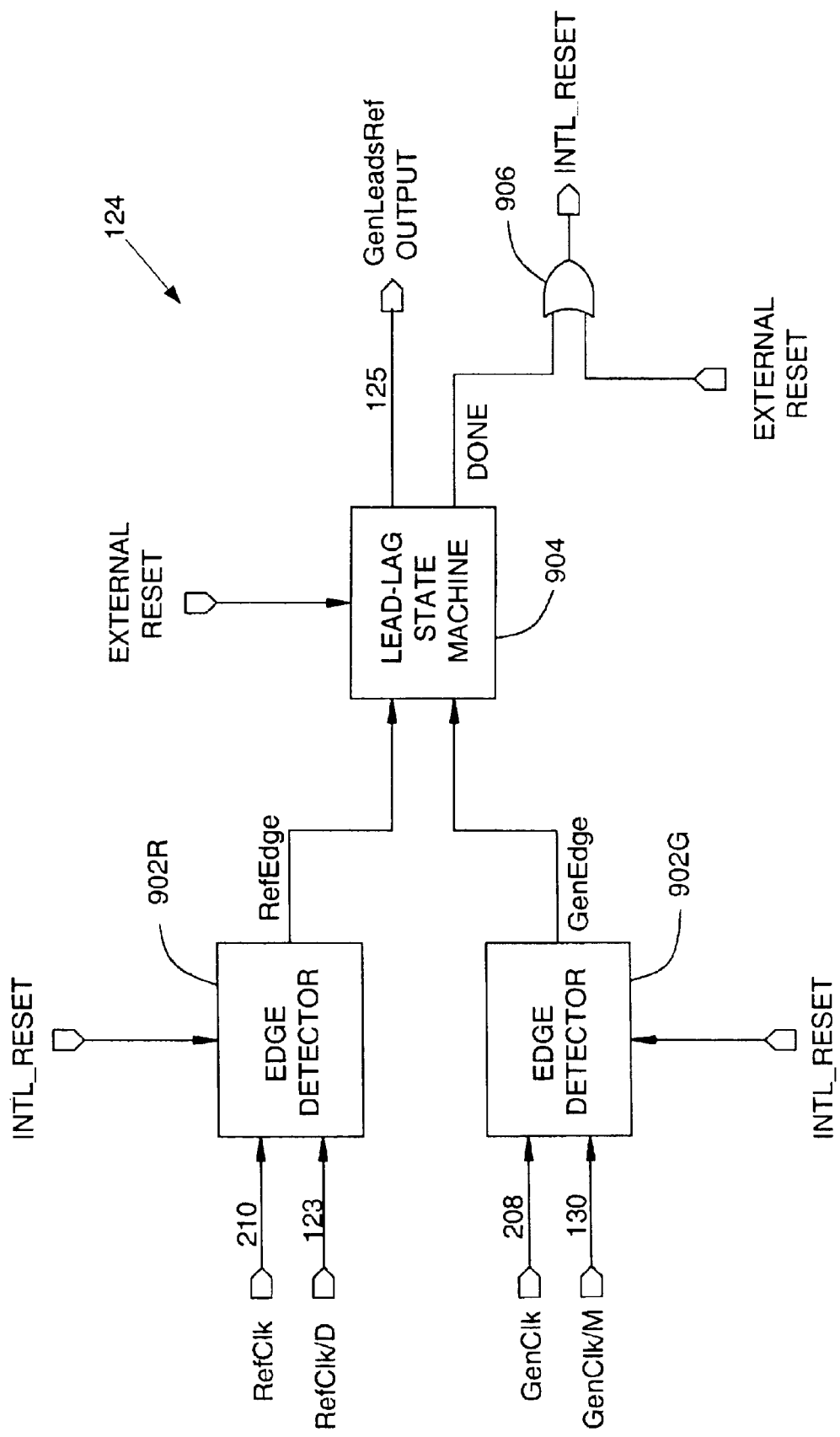
FIG. 9 shows a block diagram of phase detector 124 of FIG. 3.

FIG. 9 shows an overview of phase detector 124. Phase detector 124 includes edge detectors 902R and 902G (collectively edge detectors 902), and a lead-lag state machine 904. Phase detector 124 is responsive to clock signal RefClk, clock signal GenClk, a concurrence signal for the divided reference clock RefClk/D, and a concurrence signal for the divided generated clock GenClk/M. Phase detector 124 generates a control signal GenLeadsRef. When clock signal GenClk is leading clock signal RefClk, control signal GenLeadsRef is driven to the active state. Conversely, when clock signal GenClk is lagging clock signal RefClk, control signal GenLeadsRef is driven to the inactive state. Control signal GenLeadsRef may be used to guide clock generator 126 to produce clock signal GenClk having a frequency and phase such that clock signals GenClk and RefClk are synchronized at concurrences. Concurrence signals GenClk/M and RefClk/D act as gate signals to control the timing of phase comparisons between clock signals RefClk and GenClk, as described in more detail below.

Edge detector 902R generates an edge detection signal RefEdge, and edge detector 902G generates an edge detection signal GenEdge. When concurrence signal RefClk/D is in an active state, edge detector 902R drives edge detection signal RefEdge to the active state when the next edge of clock signal RefClk arrives. When concurrence signal GenClk/M is in the active state, edge detector 902G drives edge detection signal GenEdge to the active state when the next edge of GenClk arrives. In one embodiment, edge detectors 902 detect positive edges of the clock signals. Alternatively, edge detectors 902 may be configured to detect negative edges of the clock signals.

In one embodiment, edge detectors 902 are asynchronous level-mode sequential circuits. Edge detectors 902 asynchronously detect the next edge of their respective clock signals when their respective concurrence signals are in the active state. Thus, a level-change in a clock signal and/or a concurrence signal will cause a change in state of the edge detection signal and/or one or more internal signals in a given edge detector 902. An embodiment of operation of edge detectors 902 is described in detail below with respect to FIG. 9.

Lead-lag state machine 904 is responsive to edge detection signals RefEdge and GenEdge. Lead-lag state machine 904 incorporates asynchronous level-mode sequential circuitry. Responsive to edge detection signals RefEdge and GenEdge, lead-lag state machine 904 determines which of clock signals RefClk and GenClk is leading. If an edge of clock signal GenClk is detected first, lead-lag state machine 904 drives control signal GenLeadsRef to the active state. If an edge of input signal RefClk is detected first, lead-lag state machine 904 drives control signal GenLeadsRef to the inactive state.

After each phase comparison, lead-lag state machine 904 drives a reset signal INTL_RESET to an active state. Reset signal INTL_RESET is coupled to edge detectors 902R and 902G in order to reset edge detection signals RefEdge and GenEdge, respectively, to an inactive state. In one embodiment, an external reset signal is also coupled to lead-lag state machine 904. If the external reset signal is used, reset signal INTL_RESET is coupled to an OR gate 906 along with the external reset signal. If either reset signal INTL_RESET or the external reset signal is in the active state, edge detectors 902 will be reset. Operation of lead-lag state machine 904 is described below in more detail.

Phase detector 124 generates an output signal indicative of a phase difference between clock signals GenClk and RefClk at each concurrence. Phase detector 124 guides clock generator 126 such that clock signal GenClk is aligned with clock signal RefClk at each concurrence. In this manner, phase alignment between clock signal GenClk and RefClk is maintained.

In one embodiment, phase detector 124 only performs a, phase comparison at concurrence. Concurrence signal RefClk/D is driven to an active state for the duration of the oscillatory period of input signal RefClk immediately before concurrence. Concurrence signal GenClk/M is driven to an active state for the duration of the oscillatory period of output signal GenClk immediately before concurrence is expected. Concurrence signals RefClk/D and GenClk/M are used to gate edge detectors 902.

Figure 10:
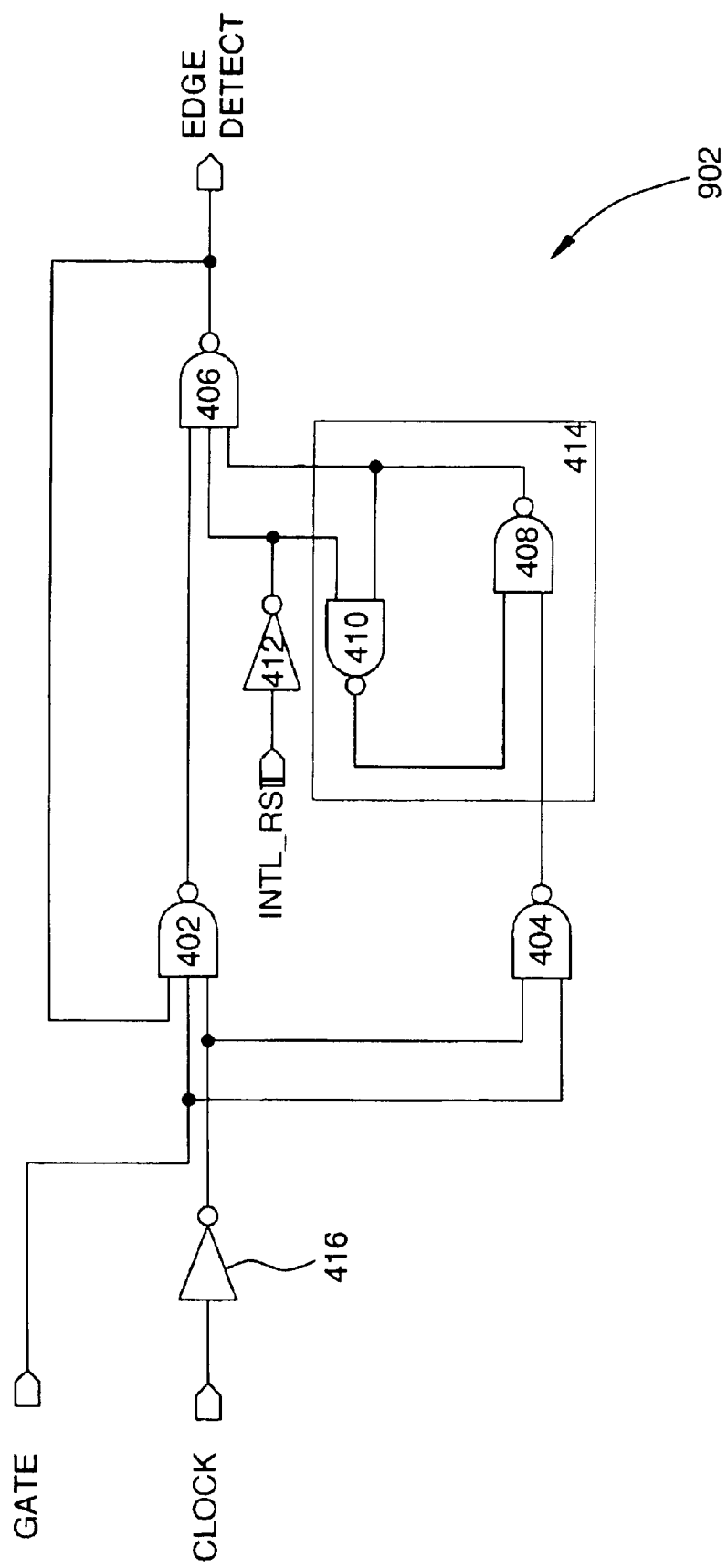
FIG. 10 shows an embodiment of edge detectors 902 of FIG. 9.

FIG. 10 shows an exemplary embodiment of edge detector 902. In one embodiment, edge detector 902 includes NAND gates 402 through 406, loop 414, and inverters 412 and 416. The loop 414 includes NAND gates 408 and 410. Edge detector 902 is responsive to gate, clock, and reset input signals. Edge detector 902 generates an edge detection output signal that indicates whether an edge in the clock input signal has arrived. In the present embodiment, the edge detection signal is an active low signal.

More specifically, the clock and reset signals are inverted by inverters 416 and 412, respectively. NAND gate 402 is responsive to the inverted clock signal, the gate signal, and the edge detection signal. NAND gate 404 is responsive to the inverted clock signal and the gate signal. NAND gate 408 is responsive to output from NAND gate 404 and output from NAND gate 410. NAND gate 410 is responsive to output from NAND gate 408 and the inverted reset signal. NAND gate 406 is responsive to output from NAND gate 402, the reset signal, and output from NAND gate 408.

In operation, the gate signal may be driven by one of concurrence signals GenClk/M and RefClk/D. The clock signal may be driven by either of clock signals GenClk and RefClk. The reset signal may be driven by reset signal INTL_RST. In an active low embodiment, the edge detection signal is initially in a logic high state and transitions to a logic low state when the gate signal is in the active state (logic high) and an edge of the clock signal arrives. When the gate signal is in the inactive state (logic low), the edge detection signal does not change in response to the clock signal. The intrinsic delay of loop 414 controls the minimum acceptable pulse width of the clock signal. Although edge detector 902 has been described as having NAND logic gates, those skilled in the art will appreciate that other combinations of logic gates can be used, such as AND gates.

Figure 1:
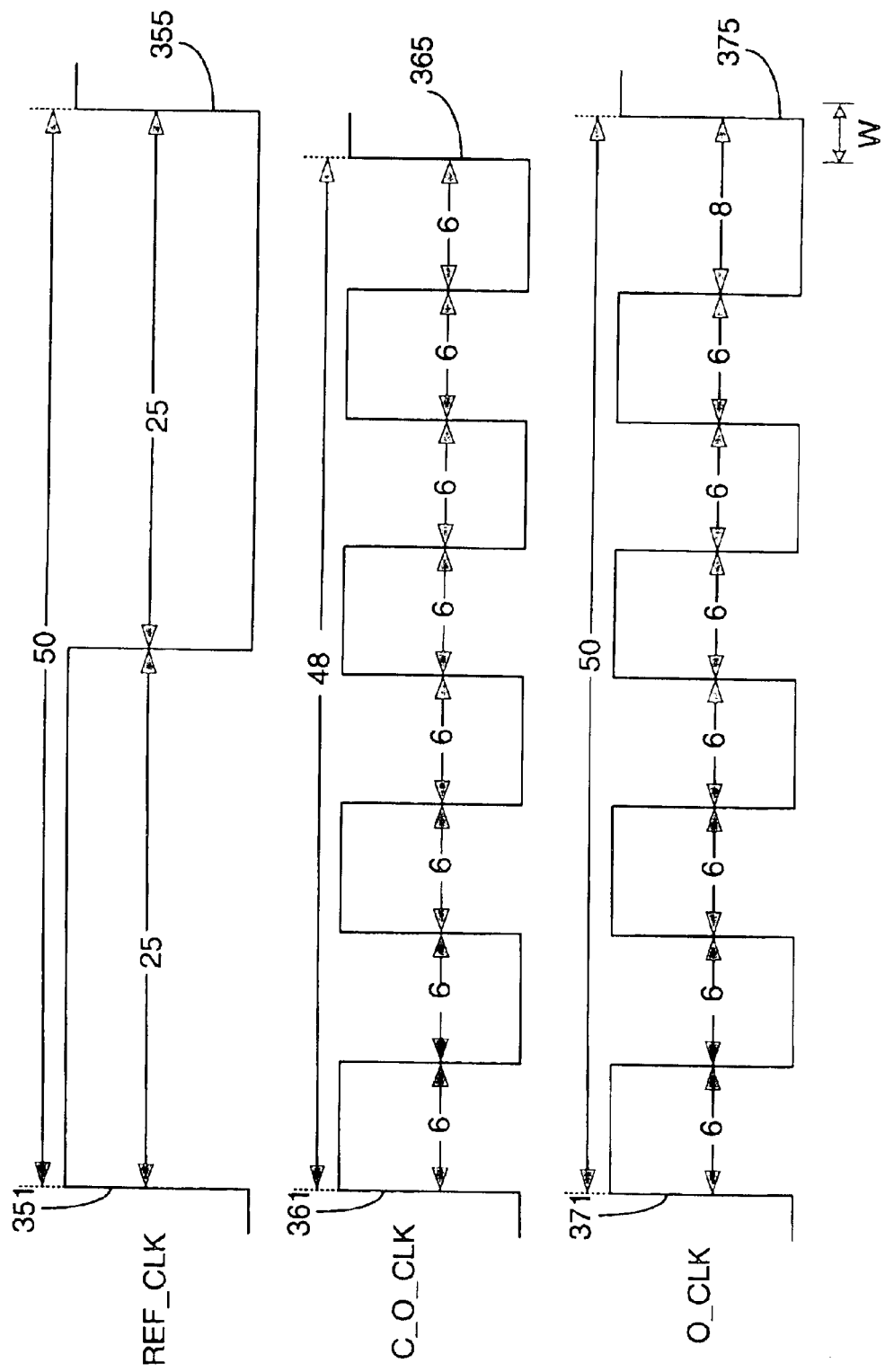
FIG. 1 shows a timing diagram of a prior art circuit in which a generated clock signal is brought into hard alignment with a reference clock signal during a pre-selected window.
Figure 11:
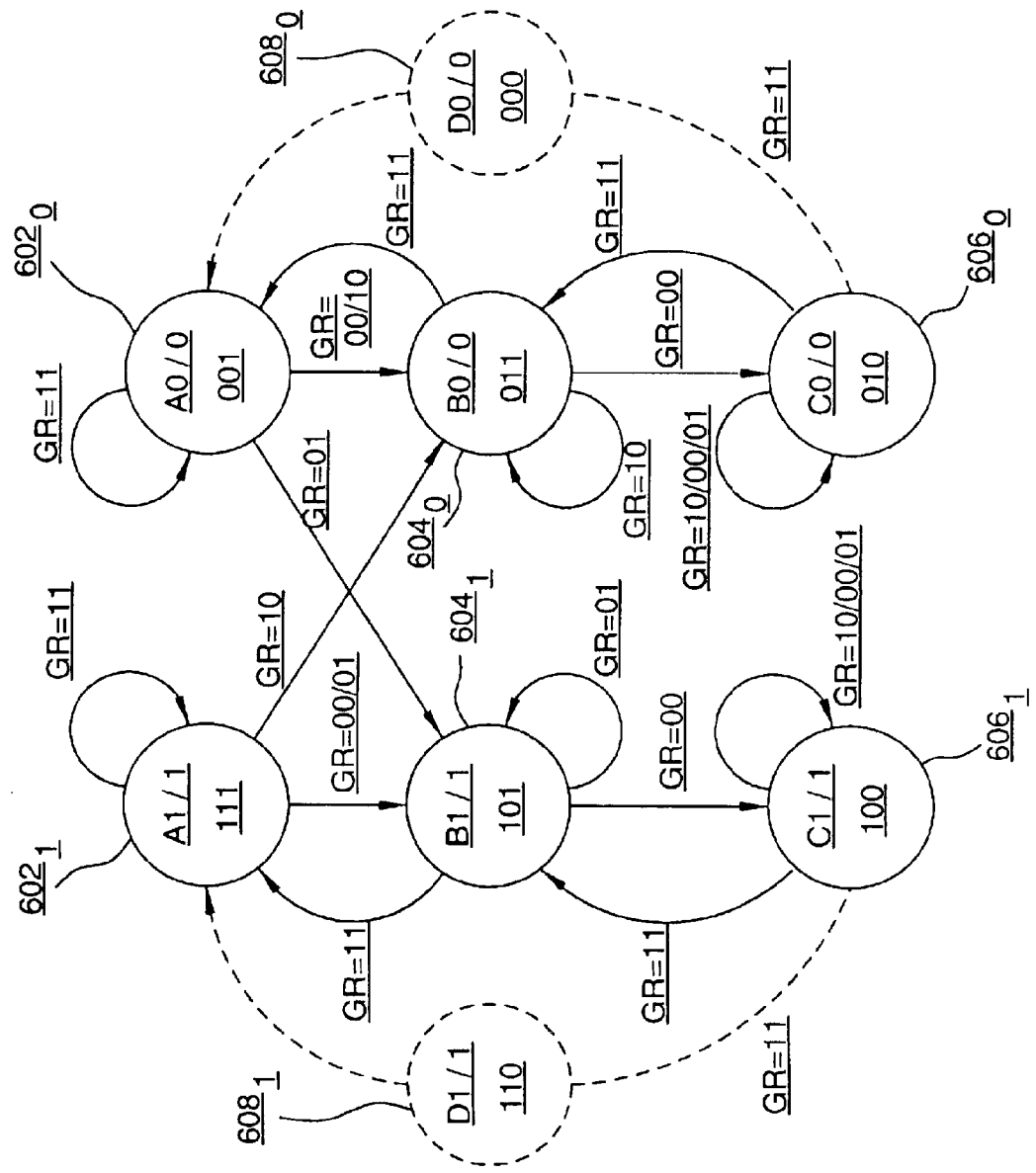
FIG. 11 shows a state diagram of state machine 904 of FIG. 9.

FIG. 11 depicts a state diagram showing an exemplary embodiment of operation of lead-lag state machine 904. In one embodiment, lead-lag state machine 904 is a Moore asynchronous level-mode state machine including initial states 602₀ and 602, (states A0 and A1, respectively), intermediate states 604₀ and 604, (states B0 and B1, respectively), and end states 606₀ and 606, (states C0 and C1, respectively). As is well known in the art, a Moore state machine provides outputs that depend only on the current state of the state machine, in contrast to a Mealy state machine in which the outputs depend on the inputs in addition to the current state of the state machine. Lead-lag state machine 904 is responsive to edge detection signal GenEdge (referred to in FIG. 11 as signal G) and edge detection signal RefEdge (referred to in FIG. 1 as signal R). In this embodiment, edge detection signals G and R are active low signals. Lead-lag state machine 904 generates output signals Y1, Y2, and Y3, at each of states 602, 604, and 606. When clock signal GenClk leads clock signal RefClk, output signal Y1 is active (high). When clock signal GenClk lags clock signal RefClk, output signal Y1 is inactive (low).

More specifically, state A0 is the initial state of lead-lag state machine 904 in a case where clock signal GenClk previously lagged clock signal RefClk. State A1 is the initial state of lead-lag state machine 904 in a case where clock signal GenClk previously led clock signal RefClk. Operation of lead-lag state machine 904 is now described starting from initial state A0.

If edge detection signals G and R are each high (GR=11), then lead-lag state machine 904 remains in state A0 and generates an output Y1, Y2, Y3 of 001. In state A0, no edges have been detected. When GR=01 (i.e., an edge is detected in clock signal GenClk), lead-lag state machine 904 transitions to state B1 and generates an output of 101. Output signal Y1 changes state, since clock signal GenClk now leads clock signal RefClk. If GR=00 (i.e., both edges have been detected at the same time) or GR=10 (i.e., an edge is detected in clock signal RefClk), lead-lag state machine 904 transitions to state B0 and generates an output of 011. Output signal Y1 remains in the same state, since clock signal GenClk still lags clock signal RefClk. Alternatively, if an edge is detected in both clock signals GenClk and RefClk (GR=00), the lead-lag state machine 904 may transition to state B1 instead of state B0.

Lead-lag state machine 904 remains in state B0 until an edge is detected in clock signal GenClk. That is, as long as GR=10, lead-lag state machine 904 remains in state B0. When GR=00, lead-lag state machine 904 transitions to state C0 and generates an output of 010. Output signal Y1 does not change state since clock signal GenClk still lags clock signal RefClk. At state C0, lead-lag state machine 904 changes the state of reset signal INTERNAL_RESET in order to reset the edge detectors 902. When edge detectors 902 are reset, GR=11 and lead-lag state machine 904 will transition from state C0, to state B0, and then to state A0. In another embodiment, lead-lag state machine 904 transitions to a transition state 608, (state D0) and then to state A0. Operation of lead-lag state machine 904 when starting from initial state A1 is symmetrical with respect to operation, starting from initial state A0. Accordingly, lead-lag state machine 904 may include a transition state 608₁ (state D1).

Figure 12:
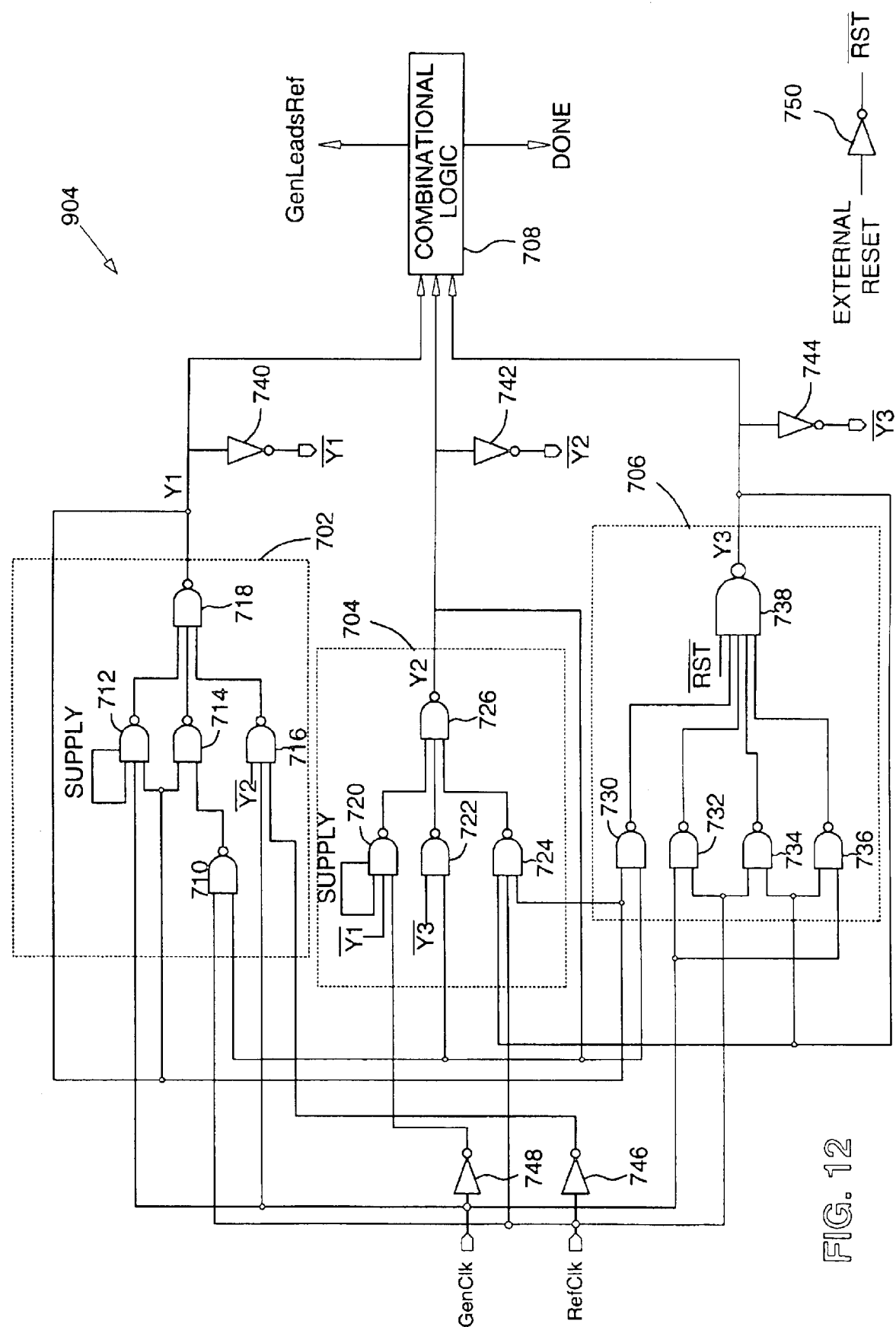
FIG. 12 shows a circuit that can implement the state diagram of FIG. 11.

FIG. 12 depicts a schematic diagram showing an exemplary embodiment of lead-lag state machine 904 in accordance with one or more aspects of the invention. Lead-lag state machine 904 comprises circuits 702, 704, and 706, as well as combinatorial logic 708. Circuit 702 generates output signal Y1; circuit 704 generates output signal Y2; and circuit 706 generates output signal Y3. Output signals Y1, Y2, and Y3 are coupled to combinatorial logic 708. Combinatorial logic 708 generates a signal DONE and control signal GenLeadsRef based on the logical values of Y1, Y2, and Y3 as described above. Inverters 740, 742, and 744 invert output signals Y1, Y2, and Y3, respectively. Inverters 746 and 748 invert clock signals RefClk and GenClk, respectively. Inverter 750 inverts the external reset signal to produce reset signal RST.

More specifically, circuit 702 includes NAND gates 710 through 718. NAND gate 710 is responsive to clock signal RefClk and output signal Y2. NAND gate 712 is responsive to a logic one signal from a supply source SUPPLY, clock signal GenClk, and output signal Y1. NAND gate 714 is responsive to output signal Y1 and the output from NAND gate 710. NAND gate 716 is responsive to clock signal GenClk, inverted clock signal RefClk, and inverted output signal Y2. NAND gate 718 is responsive to output from NAND gates 712, 714, and 716. NAND gate 718 generates output signal Y1.

Circuit 704 includes NAND gates 720 through 726. NAND gate 720 is responsive to the supply signal, inverted output signal Y1, and inverted clock signal GenClk. NAND gate 722 is responsive to output signal Y2 and inverted output signal Y3. NAND gate 724 is responsive to output signal Y3, clock signal RefClk, and output signal Y1. NAND gate 726 is responsive to output from NAND gates 720, 722, and 724. NAND gate 726 generates output signal Y2.

Circuit 706 includes NAND gates 730 through 738. NAND gate 730 is responsive to output signals Y1 and Y2. NAND gate 732 is responsive to clock signals GenClk and RefClk. NAND gate 734 is responsive to clock signal RefClk and output signal Y3. NAND gate 736 is responsive to output signal Y3 and clock signal GenClk. NAND gate 738 is responsive to output from NAND gates 730, 732, 734, and 736, as well as active low reset signal RST. NAND gate 738 generates output signal Y3.

Thus the circuit of FIG. 12 implements the state machine of FIG. 11. Other circuits can alternatively implement the state machine of FIG. 11, as would be understood by one of ordinary skill in the art.

Obvious variations derived from reading the above description are intended to be included in the scope of the invention, which is defined by the following claims. For example, although the above disclosure describes a single phase synchronizer with a single asynchronous level mode state machine for synchronizing phases of reference and clock signals, more than one phase synchronizer and more than one asynchronous level mode state machine may be used, and they may be used for aligning signals other than reference and generated clock signals.

DCVSL Oscillator-Phase Controller

Figure 13A:
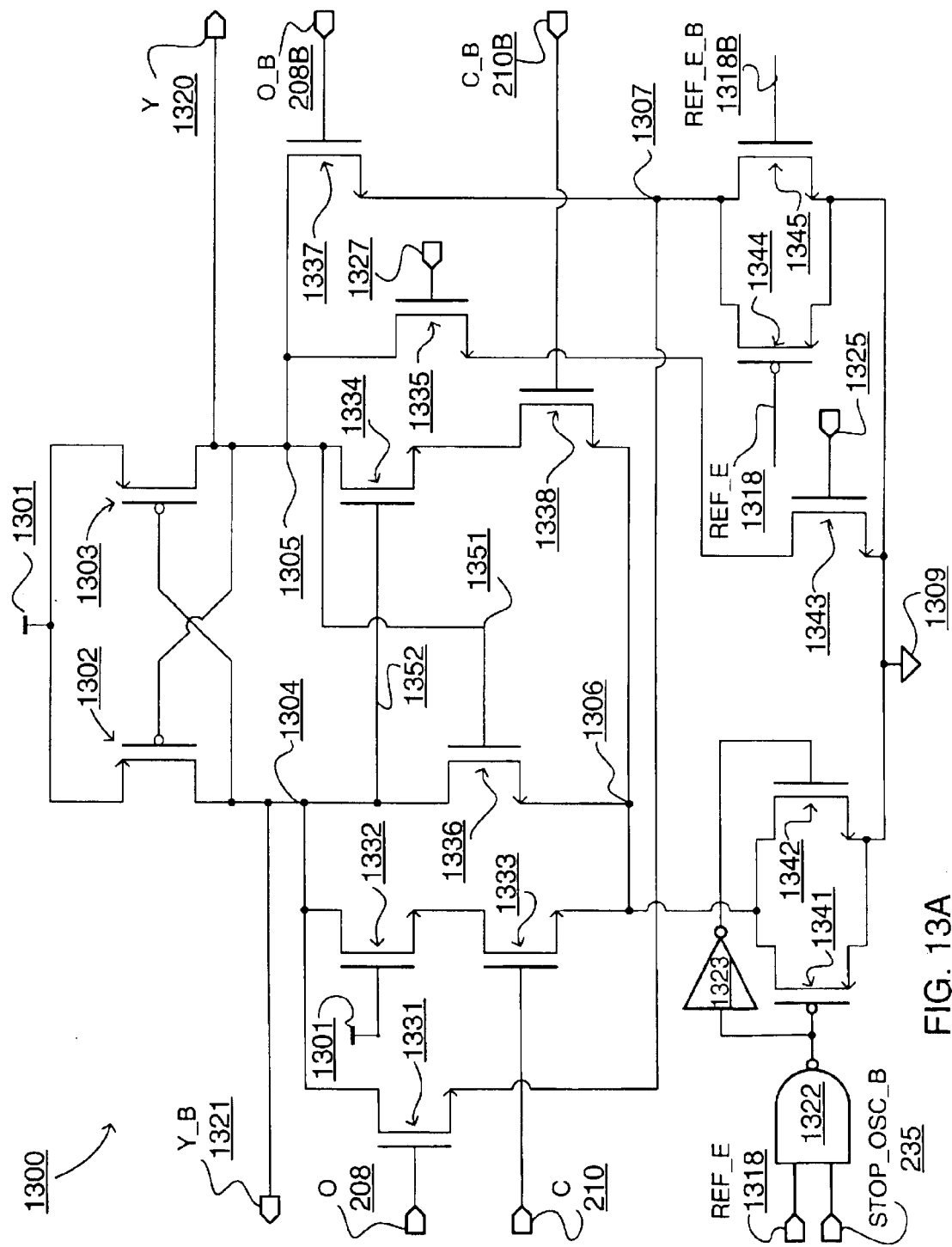
FIG. 13A is a schematic diagram depicting an exemplary embodiment of an oscillator-phase controller ("controller").

FIG. 13A is a schematic diagram depicting an exemplary embodiment of an oscillator-phase controller ("controller") 1300. Controller 1300 may replace clock generator control circuit 228 of FIG. 4. Notably, clock generator control circuit 228 of FIG. 4 provides a single-ended output, and controller 1300 provides a differential output. Additionally, it should be noted that in the clock generator control circuit 228 embodiment illustratively shown in FIG. 8, Complementary Metal-Oxide Semiconductor ("CMOS") logic is depicted, whereas in the embodiment of controller 1300 illustratively shown in FIG. 13A, a combination of CMOS logic and Differential Cascode Voltage Switch Logic ("DCVSL") is depicted.

With respect to the DCVSL portion, namely, n-type transistors 1331 through 1338, they may be manufactured to have substantially the same cross-over location. In contrast, p-type and n-type transistors of the CMOS portion will have different crossover locations. Transistor 1343 may be either part of a DCVSL portion or part of a CMOS logic portion of controller 1300.

Furthermore, p-type and n-type transistors are coupled in parallel, not because both types have to be present, but rather to reduce delay. For example, transistors 1341 and 1344 could be omitted; however, n-type transistors 1342 and 1345 may, be slow with respect to conducting low voltages, such as ground potential 1309. P-type transistors on the other hand conventionally are faster at conducting low voltages than n-type transistors. Accordingly, the addition of p-type transistors 1341 and 1344 reduces delay as they are helper transistors for n-type transistors 1342 and 1345, respectively. Moreover, n-type transistors 1342 and 1345 could be omitted respectively in favor of p-type transistors 1341 and 1344; however, having n-type transistors 1342 and 1345 enhances overall conductivity and thus reduces delay.

Lastly, for convenience and clarity, the more immediate description of operation of controller 1300 is in terms of passing edges. However, from the latter description of controller 1300 it will be apparent that edges are not actually passed, rather an edge of a reference signal, such as reference, clock signal, is propagated to an output, such as a differential output.

Figure 13B:
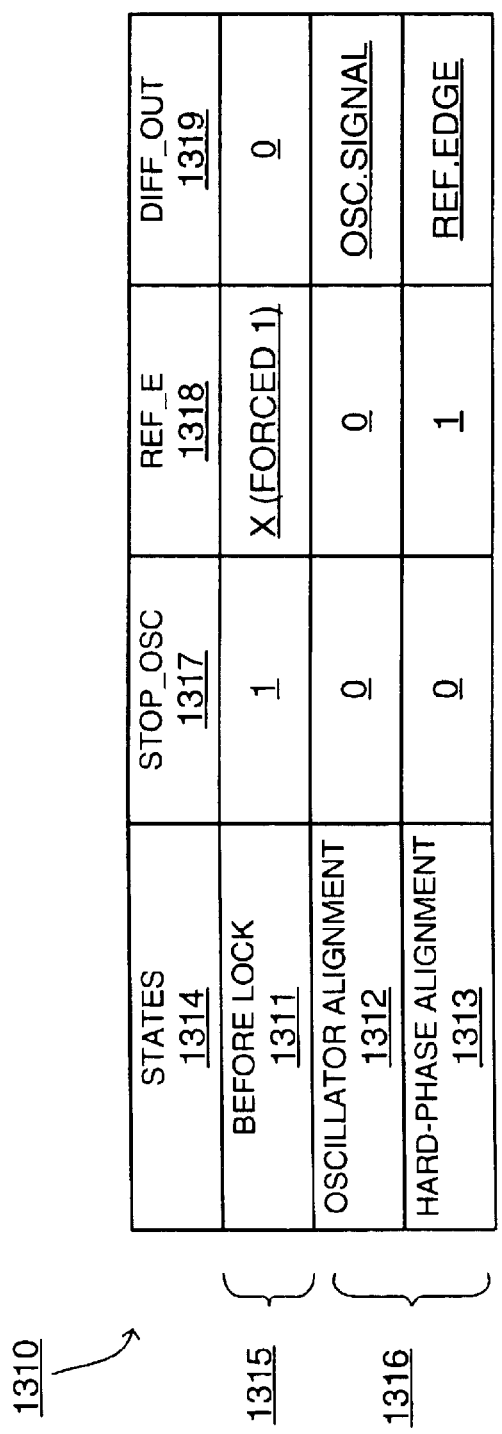
FIG. 13B is a table diagram depicting a truth table for states of the controller of FIG. 13A.

FIG. 13B is a table diagram depicting a truth table 1310 for states of controller 1300. Table 1310 includes three states 1314 for conditions 1315 and 1316.

With continuing reference to FIG. 13B and renewed reference to FIG. 13A, truth table 1310 and controller 1300 are further described. Condition 1315 is a pre-lock condition, namely, prior to frequency locking to a reference signal, such as reference clock signal ("C") 210. Condition 1316 is a post-lock lock condition, namely, after frequency locking to a reference signal, such as reference clock signal ("C") 210.

For condition 1315, there is one state for controller 1300, namely, before lock state 1311. In other words, controller 1300 is not activated for controlling phase prior to frequency locking to a reference clock signal. After frequency locking to a reference clock signal, controller 1300 is activated for controlling phase and this is referred to as condition 1316. For condition 1316 there are two states, namely, oscillator alignment state 1312 and hard-phase alignment state 1313.

Figure 13C:
FIG. 13C is a schematic diagram depicting an exemplary embodiment of signal buffering circuit.

FIG. 13C is a schematic diagram depicting an exemplary embodiment of a signal buffering circuit 1350. Inverters 1346 and 1347 are connected in series. Reference edge signal 1318, which is used to transition to hard-phase alignment state 1313, is provided to inverter 1346, the output of which is phase control signal 237. Phase control signal 237 is provided to inverter 1347, the output of which is an inverted version of phase control signal 237, namely, phase control signal 1327. For purposes of clarity, phase control signal 237 is hereinafter referred to as reference edge signal 1318B.

Figure 13D:
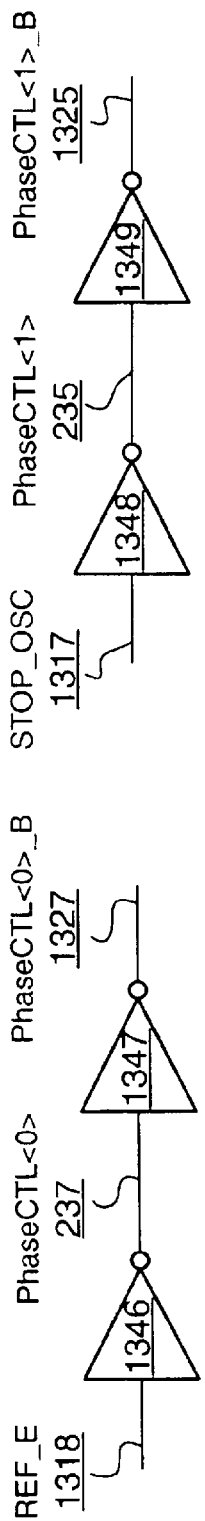
FIG. 13D is a schematic diagram depicting an exemplary embodiment of another signal buffering circuit.

FIG. 13D is a schematic diagram depicting an exemplary embodiment of signal buffering circuit 1351. Inverters 1348 and 1349 are connected in series. Stop oscillator signal 1317, which is used to transition between conditions 1315 and 1316, is provided to inverter 1348, the output of which is phase control signal 235. Phase control signal 235 is provided to inverter 1349, the output of which is an inverted version of phase control signal 235, namely, phase control signal 1325. For purposes of clarity, phase control signal 1325 is hereinafter referred to as stop oscillator signal 235.

Returning to FIG. 13A, operation of controller 1300 is described. For before lock state 1311, stop oscillator signal 1317 of FIG. 13D is logic one and reference edge signal 1318 is at an arbitrary voltage level (i.e., a "don't care") which is forced to logic one. Reference edge signal 1318 gates p-type transistor 1344, and inverted reference edge signal 1318B gates n-type transistor 1345. Transistors 1344 and 1345 are connected in parallel having their drain terminals commonly connected to ground 1309 and their source terminals commonly connected to node 1307.

Accordingly, when in before lock state 1311, transistors 1344 and 1345 are both in a substantially non-conductive state ("switched off"). Thus, when in before lock state 1311, other transistors connected to node 1307 are switched off. In other words, n-type oscillator output transistors 1331 and 1337, each of which has its drain terminal connected to node 1307, are disabled when controller 1300 is in before lock state 1311.

Phase control signal 1325 gates n-type before lock transistor 1343. A drain terminal of before lock transistor 1343 is connected to ground 1309, and a source terminal of transistor 1343 is connected to a drain terminal of before lock transistor 1335. Before lock transistor 1335 and oscillator output transistor 1337 have their respective source terminals commonly connected to output node 1305. Output node 1305 is a tap location for obtaining output signal ("Y") 1320. Before lock transistor 1335 is gated with phase control signal 1327, a buffered version of reference edge signal 1318.

When stop oscillator signal 1317 is logic high, phase control signal 1325, a buffered version of stop oscillator signal 1317, is logic high. Thus, transistor 1343 is in a substantially conductive state ("switched on"), and transistor 1335 is switched on. Accordingly, output node 1305 is coupled to ground 1309 via transistors 1343 and 1335 when controller 1300 is in before lock state 1311. Notably, transistors 1335 and 1343 are only switched on for before lock state 1311.

When output node 1305 is logic low, such as when it is coupled to ground 1309, p-type load transistor 1302, having its gate terminal connected to output node 1305, is switched on. Source terminals of p-type load transistors are commonly coupled to supply voltage source 1301. A drain terminal of load transistor 1302 is connected to output node 1304, which is a tap for output signal ("Y_B") 1321, an inverted version of output signal 1320. Output signals 1320 and 1321 in combination provide a differential output 1319.

In before lock state 1311, transistor 1302 is switched on, and thus voltage at output node 1304 is a logic one. A gate terminal of p-type load transistor 1303 is connected to output node 1304, and a drain terminal of p-type load transistor 1303 is connected to output node 1305. Thus, when voltage at output node 1304 is logic high, such as when controller 1300 is in before lock state 1311, p-type transistor 1303 is switched off.

Reference edge signal 1318 and stop oscillator signal 235 are inputs to NAND gate 1322. Output of NAND gate 1322 gates p-type transistor 1341 and is provided to inverter 1323. Output of inverter 1323 gates n-type transistor 1342. Transistors 1341 and 1342 are connected in parallel with their drain terminals commonly connected to ground 1309 and their source terminals commonly connected to node 1306. When in before lock state 1311, output of NAND gate 1322 is logic high. Accordingly, transistors 1341 and 1342 are switched off and thus node 1306 is tri-stated as it is not electrically coupled to ground 1309.

N-type transistors 1333, 1336, and 1338 have their drain terminals commonly connected to node 1306. Thus, when controller 1300 is in before lock state 1311, transistors 1333, 1336, and 1338 are not electrically coupled to ground 1309 through transistor 1341 and 1342.

Transistor 1332 has its gate terminal coupled to receive supply voltage source 1301, and thus transistor 1332 is continuously switched on to provide a resistance. Providing a resistance with a continuously switched on transistor is merely an implementation detail, which may be omitted. A source terminal of transistor 1332 is connected to output node 1304, and a drain terminal of transistor 1332 is connected to a source terminal of transistor 1333.

A source terminal of feedback transistor 1334 is connected to output node 1305, and a drain terminal of feedback transistor 1334 is connected to a source terminal of clock output transistor 1338. A gate terminal of feedback transistor 1334 is connected to output node 1304.

A source terminal of feedback transistor 1336 is connected to output node 1304, and a drain terminal of feedback transistor 1336 is connected to node 1306, as previously stated. A gate terminal of feedback transistor 1336 is connected to output node 1305.

Clock output transistor 1333 is gated with clock signal 210, and clock output transistor 1338 is gated with an inverted version of clock signal 210, namely, clock signal ("C_B") 210B. Thus, clock signals 210 and 210B together form a differential clock signal input to controller 1300. A source terminal of clock output transistor 1333 is coupled to output node 1304 via conductive state transistor 1332. A source terminal of clock output transistor 1338 is coupled to output node 1305 via feedback transistor 1334.

Oscillator output transistor 1331 is gated with oscillator signal 208, and oscillator output transistor 1337 is gated with an inverted version of oscillator signal 208, namely, oscillator signal ("O_B") 208B. Thus, oscillator signals 208 and 208B together form a differential oscillator signal input to controller 1300. A source terminal of oscillator output transistor 1331 is connected to output node 1304, and a source terminal of oscillator output transistor 1337 is connected to output node 1305. Notably, in before lock state 1311, oscillator signals 208, 208B may be off, such that a logic low value is provided for each of them, and thus oscillator output transistors 1331 and 1337 would be switched off.

Figure 14:
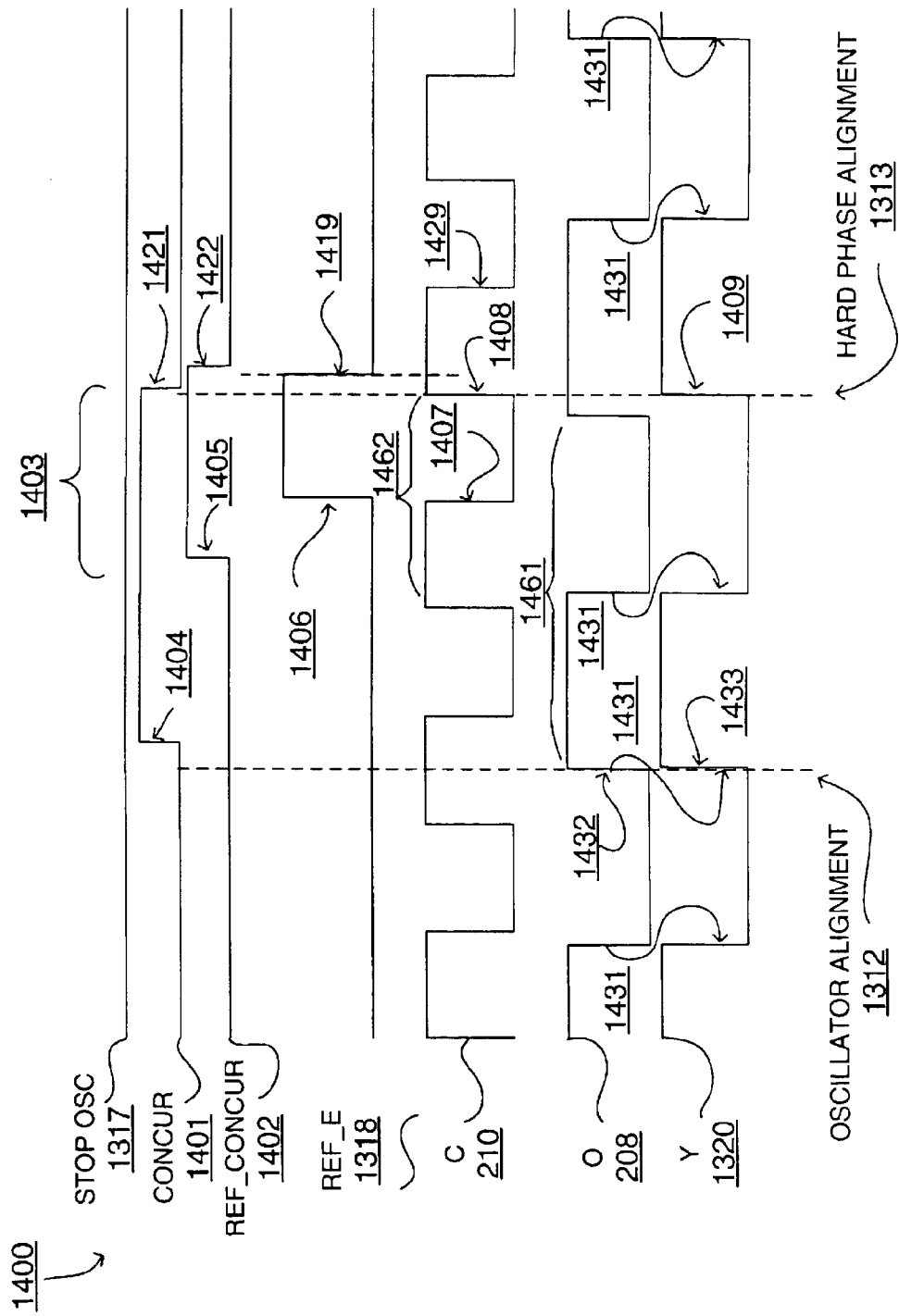
FIG. 14 is a signal diagram depicting an exemplary embodiment of signals associated with the controller of FIG. 13A.

FIG. 14 is a signal diagram depicting an exemplary embodiment of signals associated with controller 1300 of FIG. 13A with simultaneous reference to FIGS. 13A, 13B, and 14, operation of controller 1300 is further described.

As negative logic will be apparent from the positive logic signal description which follows, complemented signals are omitted for purposes of clarity. Notably, for FIG. 14, stop oscillator signal 1317 is shown in a logic low state, meaning that controller 1300 is in post-lock condition 1316. As prelock condition 1315 was described above, FIG. 14 is for postlock condition 1316. Moreover, some jitter is assumed to be present in the signals illustratively shown in FIG. 14.

For digital frequency synthesis, as described herein, a reference signal having a frequency f is obtained, from which another signal having a frequency f(M/D) is generated. Again, because frequencies between a reference signal and a generated signal are different, not all edges will phase align. Thus, it is important to periodically obtain phase lock to keep a generated signal at least roughly in phase with a reference signal.

In a classical analog environment, a phase-locked loop ("PLL") may be used to lock phase with respect to a variable voltage. However, in a digital system, a phase detector is limited to indicating whether phase leads or lags, but not by how much. Furthermore, in a classical digital system, phase trimming is limited to a granularity, such as a time interval between taps of a delay line. What follows is a description of controller 1300 indicating that periodic phase lock is established which is at least substantially close to a hard-phase lock with a reference signal without use of a PLL. This is done by passing an edge, such as a rising edge, of the reference signal as part of an output of controller 1300. This is done during an opportunity of a concurrence cycle.

After a frequency lock has been established, there will be instances of concurrence, as described above. Responsive to M cycles of oscillator signal 208, concurrence signal ("Concur") 1401 transitions from logic low to logic high at 1404, and stays logic high responsive to an Mth cycle 1461 of oscillator signal 208. Responsive to the conclusion of Mth cycle 1461 of oscillator signal 208, concurrence signal 1401 transitions from logic high to logic low generally at 1421. Notably, edges 1404 and 1421 may respectively lag the beginning and ending of Mth cycle 1461 as illustratively shown due to propagation delay or jitter.

Responsive to D cycles of clock signal 210, reference concurrence signal ("Ref_Concur") 1402 transitions from logic low to logic high at 1405, and stays logic high responsive to an Dth cycle 1462 of clock signal 210. Responsive to the conclusion of Dth cycle 1462 of clock signal 210, reference concurrence signal 1402 transitions from logic high to logic low generally at 1422. Notably, edges 1405 and 1422 may respectively lag the beginning and ending of Dth cycle 1462 as illustratively shown due to propagation delay or jitter. Notably, a general location of tailing edges of concurrence signal 1401 and reference concurrence signal 1402 is identified, because if there were no jitter, tailing edges 1421 and 1422 would be aligned with one another.

When both concurrence signal 1401 and reference concurrence signal 1402 are logic high, a window 1403 exists for passing an edge of clock signal 210 for hard-phase alignment 1313. Responsive to existence of window 1403 and relative spacing of oscillator signal 208 and clock signal 210, such as may be tracked with a state machine as described above, reference edge signal 1318 is generated. Following edges 1404 and 1405 of concurrence signal 1401 and reference concurrence signal 1402, respectively, and following a falling edge 1407 of clock signal 210, reference edge signal 1318 transitions generally at 1406 from logic low to logic high. Notably, to pass a rising edge, and not a falling edge, within Dth cycle 1462, reference edge signal 1318 is not triggered until after falling edge 1407.

Reference edge signal 1318 is used in part to activate hard-phase alignment 1313. Thus, while reference edge signal 1318 is high, a rising edge 1408, namely, the edge following failing edge 1407, is passed by controller 1300 as part of its output. Thus, output signal ("Y") 1320 outputs a rising edge 1409 associated with edge 1408 of clock signal 210 for hard-phase alignment 1313. Notably, because the reference signal frequency is different by M/D of a generated frequency, edge 1429 of clock signal 210 is not to be passed to output signal 1320. Thus, reference edge signal 1318 is to transition from logic high to logic low generally at 1419 prior to edge 1429 becoming available.

While reference edge signal 1318 may transition from logic high to logic low responsive to the earlier of either edge 1421 or edge 1422 of concurrence signal 1401 or reference concurrence signal 1402, respectively, a problem may exist if frequency of reference clock signal 210 is too high. For a fast reference clock signal 210, it is possible that both edges 1421 and 1422 occur too late to cause reference edge signal 1318 to transition from logic high to logic low prior to assertion of falling edge 1429. To avoid this possibility, rising edge 1408 is passed to output signal 1320, and then responsive to feedback within controller 1300 associated with such passage, controller 1300 asynchronously changes from hard-phase alignment state 1313 to oscillator alignment state 1312.

It should be understood that hard-phase alignment state 1313 for a post-lock condition 1316 has been described, namely, where stop oscillator signal 1317 is logic low and reference edge signal 1318 is logic high, so differential output 1319 passes a reference edge 1408. Differential output 1319 includes output signal 1320 and an inverted version thereof, namely, output signal ("Y_B") 1321.

For oscillator alignment state 1312 of post-lock condition 1316, transitions 1431 of oscillator signal 208 are passed to output signal 1320 of controller 1300. For example, edge 1432 of oscillator signal 208 is passed to output signal 1320 as edge 1433 for oscillator alignment 1312.

Notably, from the above signal diagram, it is apparent that a leading edge of clock signal 210 is passed for hard-phase alignment 1313 on output signal 1320. Additionally, it should be understood that a trailing edge of clock signal 210B will be passed for hard-phase alignment 1313 on output signal 1321 as output is differential.

Now, having an understanding of signal processing by controller 1300, circuit operation of controller 1300 is further described with simultaneous reference to FIGS. 13A–13D and FIG. 14.

When in oscillator alignment state 1312, stop oscillator signal 1317 and reference edge signal 1318 are both logic low. Accordingly, output of NAND gate 1322 is a logic one, and transistors 1341 and 1342 are switched off. Because node 1306 is not electrically coupled to ground, as transistors 1341 and 1342 are switched off, transistors 1332, 1333, 1334, 1336, and 1338 are disabled. Transistor 1343 is switched off, and so transistor 1335 is disabled. Transistor 1344 and 1345 are switched on. Thus, node 1307 is electrically coupled to ground via transistors 1344 and 1345 during oscillator alignment state 1312. Oscillator output transistors 1331 and 1337 are active during oscillator alignment state 1312. Thus, of all the DCVSL transistors, only oscillator output transistors 1331 and 1337 may be active during oscillator alignment state 1312.

Accordingly, as oscillator signal 208 switches transistor 1331 on and off, output node 1304 is respectively electrically coupled and decoupled to ground 1309. When output node 1304 is electrically coupled to ground, load transistor 1303 is responsively switched on thereby causing output node 1305 to be driven to supply voltage level 1301 (i.e., a logic high level) via load transistor 1303 and forcing load transistor 1302 to be switched off. Therefore, a version of oscillator signal 208 is provided as output signal 1320, and an inverted version of oscillator signal 208 is provided as output signal 1321. Notably, the actual oscillator signals 208 and 208B are not passed to outputs of controller 1300. Rather, by using voltage levels of oscillator signals 208 and 208B to switch transistors on and off, outputs of controller 1300 are versions of oscillator signals 208 and 208B. Thus, actual edges of a source signal are not passed to outputs. Rather, propagated versions of source signals are passed having edges which are closely associated with source signal edges.

As oscillator signal 208B switches transistor 1337 on and off, output node 1305 is respectively electrically coupled and decoupled to ground 1309. When output node 1305 is electrically coupled to ground, load transistor 1302 is responsively switched on thereby causing output node 1304 to be driven to a supply voltage level 1301 (i.e., a logic high level) via load transistor 1302 and forcing load transistor 1303 to be switched off. Therefore, a version of oscillator signal 208B is provided as output signal 1321, and an inverted version of oscillator signal 208B is provided as output signal 1320.

In short, when in oscillator alignment state 1312, controller 1300 acts like a buffer for outputting oscillator signals 208 and 208B as output signals 1320 and 1321, respectively. Thus, it should be understood how edges 1431 of oscillator signal 208 are mirrored to output signal 1320, as previously mentioned, when in oscillator alignment state 1312. Furthermore, it should be appreciated that in this signal propagating mode, there is no stoppage of oscillator signals 208 and 208B. Rather, oscillator signals 208 and 208B are free-running, which facilitates providing continuity in output signals of controller 1300.

From oscillator alignment state 1312, controller 1300 may transition to hard-phase alignment state 1313 responsive to reference edge signal 1318 transitioning from logic low to logic high, as previously described. Notably, it should be appreciated from the description that follows that discontinuity in an output signal of controller 1300 is avoided when propagating an edge of reference clock signal 210 to such output signal. In other words, controller 1300 does not idle while waiting for an edge of a reference signal for hard-phase alignment. This is in part due to controller 1300 operation being fully combinational when in oscillator alignment state 1312. In other words, outputs may be determined from inputs without any reference to prior state.

However, for hard-phase alignment, prior state is used for feedback, and thus when in a hard-phase alignment state, controller 1300 is a sequential circuit. Whether combinational or sequential, controller 1300 operates without being separately clocked with a system clock signal (i.e., pseudo-asynchronously), as oscillator signals and clock signals are used as control inputs to provide outputs.

Dependence on prior state of controller 1300 arises when propagating an edge of clock signal 210 to an output of controller 1300. It will be apparent that dependence on prior state only within a narrow window for propagating an edge of clock signal 210 for hard-phase alignment substantially reduces or avoids discontinuity in output signaling of controller 1300.

When stop oscillator signal 1317 is logic low and reference edge signal 1318 is logic high, transistor 1343 stays switched off, output of NAND gate 1322 changes to a logic zero, and transistors 1344 and 1345 are switched off. Accordingly, node 1307 is not electrically coupled to ground, and oscillator output transistors 1331 and 1337 are disabled to allow a reference clock signal edge to be passed by controller 1300. A logic low output voltage from NAND gate 1322 causes transistors 1341 and 1342 to be switched on, thereby electrically coupling node 1306 to ground, as well as transistors 1333, 1336, and 1338.

Prior to a rising edge, such as edge 1408, of clock signal 210, inverted clock signal 210B is logic high. Thus, transistor 1338 is switched on, and transistor 1333 is switched off as clock signal 210 is logic low when clock signal 210B is logic high. In a state prior to passing rising edge 1408, output 1320 is logic low. A logic low at output node 1305 causes output node 1304 to be driven to a logic high state. Responsive to output node 1304 being logic high, transistor 1334 is switched on.

Accordingly, as clock signal 210 switches transistor 1333 on, output node 1304 is electrically coupled to ground 1309 and transistor 1338 is switched off by clock signal 210B. State at output node 1304 transitions from a logic high level to a logic low level, and responsive to output node 1304 being logic low, transistor 1334 is switched off via feedback path 1352.

When output node 1304 is electrically coupled to ground, load transistor 1303 is responsively switched on thereby causing output node 1305 to be driven to a logic high voltage level. Accordingly, output node 1305 transitions from a previous state of logic zero to a state of logic one. In response to output node 1305 being a logic one, feedback transistor 1336 is switched on via feedback path 1351. Responsive to transistor 1336 being switched on, output nodes 1304 and 1352 are both electrically coupled to node 1306, which is electrically coupled to ground 1309 during hard-phase alignment state 1313. In other words, a latched state is obtained responsive to a previous state and passing an edge of a reference signal.

Thus, a latched state is held, until transition from hard-phase alignment state 1313 to oscillator alignment state 1312. This transfer of state is responsive to a falling edge of reference edge signal 1318. Responsive to reference edge signal 1318 transitioning from logic high to logic low, transistors 1341 and 1342 switched off and transistors 1344 and 1345 are switched on. Accordingly, oscillator control is propagated responsive to clock signals 210 and 210B to provide outputs 1320 and 1321 using oscillator signals 208 and 208B.

It may be desirable to provide electrical coupling to and from ground with an all DCVSL circuit, such as with all n-type transistors. It should be understood that DCVSL signals have different properties than CMOS signals, particularly with respect to crossover points. Thus, it should be appreciated that signals 1320, 1321 are DCVSL signals. Notably, clock and oscillator signal, such as clock signals 210 and 210B, and oscillator signals 208 and 208B, may both be provided from CMOS for CMOS signaling or both provided from NMOS for DCVSL signaling.

Figure 15:
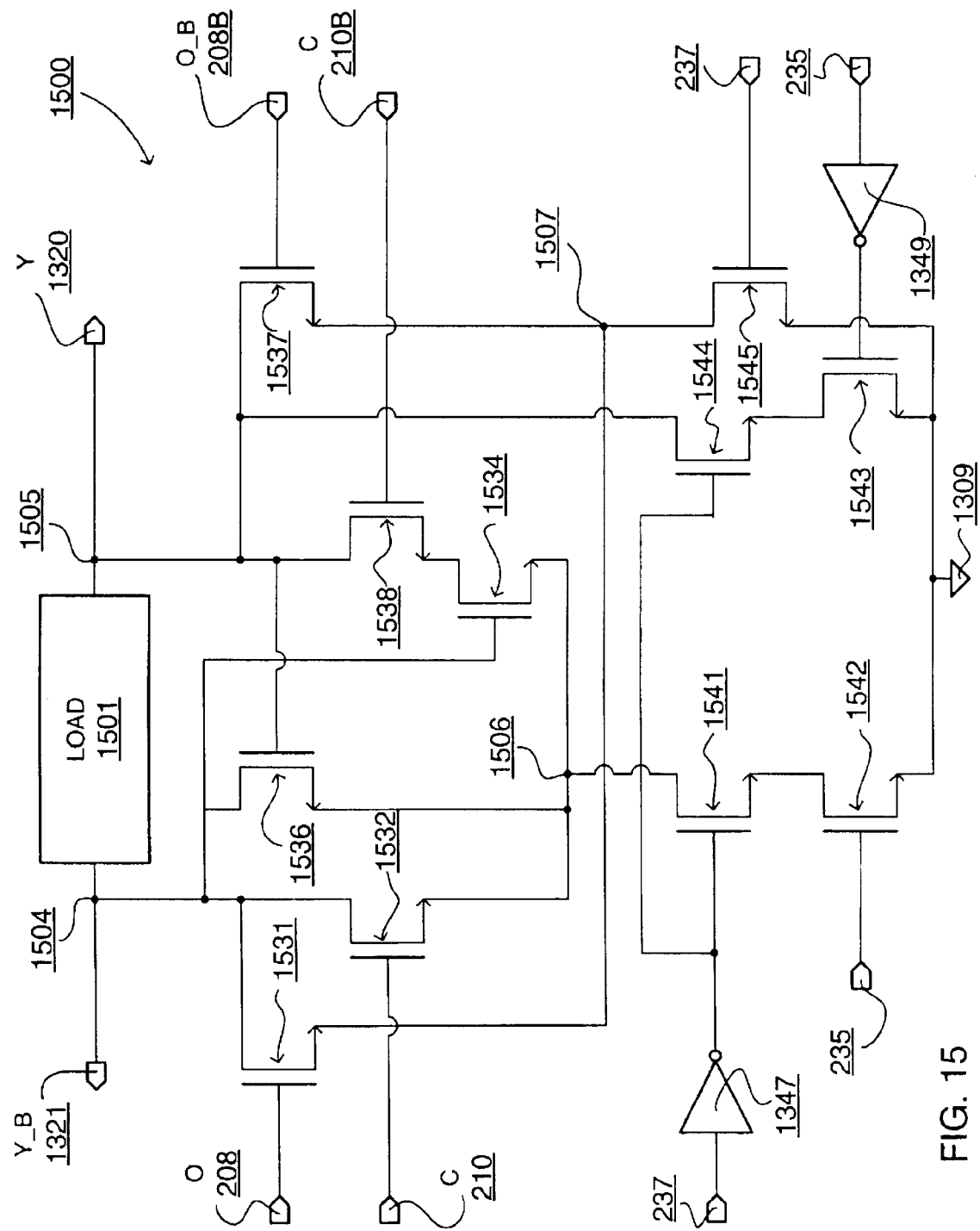
FIG. 15 is a schematic diagram depicting an exemplary embodiment of an oscillator-phase controller ("controller") using only n-type transistors for electrically coupling and decoupling to ground.

FIG. 15 is a schematic diagram depicting an exemplary embodiment of an oscillator-phase controller ("controller") 1500 using only n-type transistors for electrically coupling and decoupling to ground 1309. Controller 1500 operates similarly to controller 1300 of FIG. 13A, and thus repetitious description is avoided for purposes of clarity.

Load 1501, such as may be provided with p-type transistors as previously described, is coupled to output nodes 1504 and 1505 from which output signals 1321 and 1320 are respectively sourced. Drain terminals of n-type transistors 1531, 1532 and 1536 are connected to output node 1504. Drain terminals of n-type transistors 1537, 1538, and 1544 are connected to output node 1505. A gate terminal of n-type transistor 1534 is connected to output node 1504, and a gate terminal of n-type transistor 1536 is connected to output node 1505. A drain terminal of transistor 1534 is connected to a source terminal of transistor 1538. Transistor 1531 is gated with oscillator signal 208, and transistor 1537 is gated with oscillator signal 208B. Transistor 1532 is gated with clock signal 210, and transistor 1538 is gated with clock signal 210B. A respective source terminal of each of transistors 1532, 1534, and 1536 is connected to reference signal grounding node 1506, and a respective source terminal of each of transistors 1531 and 1537 is connected to oscillator signal grounding node 1507.

Output of inverter 1347 gates n-type transistors 1541 and 1544. A drain terminal of transistor 1541 is connected to node 1506. N-type transistor 1542 is gated with phase control signal 235. A drain terminal of transistor 1542 is connected to a source terminal of transistor 1541, and a source terminal of transistor 1542 is coupled to ground 1309.

Output of inverter 1349 gates n-type transistor 1543. A drain terminal of transistor 1543 is connected to a source terminal of transistor 1544, and a source terminal of transistor 1543 is coupled to ground 1309. Phase control signal 237 gates n-type transistor 1545. A drain terminal of transistor 1545 is connected to node 1507, and a source terminal of transistor 1545 is coupled to ground 1309.

With renewed reference to FIG. 13B and continuing reference to FIG. 15, operation of controller 1500 is described.

In before lock state 1311, phase control signal 235 is logic low, and phase control signal 237 is logic low. Accordingly, transistors 1542 and 1545 are switched off and transistors 1543 and 1544 are switched on. Transistor 1541, though switched on, is electrically decoupled from ground via transistor 1542, and thus node 1506 is decoupled from ground. Accordingly, as node 1506 is electrically decoupled from ground, transistors 1532, 1534, 1536, and 1538 may be ignored in before lock state 1311. Furthermore, switched off transistor 1545 electrically decouples node 1507 from ground, and thus transistors 1531 and 1537 may be ignored in before lock state 1311.

In before lock state 1311, transistors 1543 and 1544 electrically couple output node 1505 to ground 1309. With output node 1505 at a logic low state, output node 1504 is driven to a logic high state via load 1501.

When controller 1500 is in oscillator alignment state 1312, transistors 1541, 1543, and 1544 are all switched off. Transistor 1545 is switched on thereby electrically coupling node 1507 to ground 1309. Accordingly, node 1506 is electrically decoupled from ground, and thus transistors 1532, 1534, 1536, and 1538 may be ignored while controller 1500 is in oscillator alignment state 1312.

For controller 1500 in oscillator alignment state 1312, each source terminal of transistors 1531 and 1537 is electrically coupled to ground 1309 via transistor 1545. Accordingly, output node 1504 is electrically coupled to ground 1309 responsive to oscillator signal 208 switching on transistor 1531, thereby driving output node 1505 to a logic high level via load 1501. Moreover, output node 1505 is electrically coupled to ground 1309 responsive to oscillator signal 208B switching on transistor 1537, thereby driving output node 1504 to a logic high level via load 1501.

For controller 1500 in a hard-phase alignment state 1313, phase control signal 237 is logic low and phase control signal 235 is logic high. Accordingly, node 1506 is electrically coupled to ground via switched on transistors 1541 and 1542. Though transistor 1544 is switched on, transistor 1543 is switched off thereby maintaining electric decoupling of transistor 1544 from ground 1309. Transistor 1545 is switched off electrically decoupling node 1507 from ground 1309, and thus transistors 1531 and 1537 may be ignored while controller 1500 is in hard-phase alignment state 1313.

For node 1506 electrically coupled to ground 1309, source terminals of transistors 1532, 1534, and 1536 are electrically coupled to ground 1309. Transistors 1532 and 1538 are responsively switched on and off respectively to clock signal 210 and clock signal 210B.

When clock signal 210B has transistor 1538 switched on, transistor 1532 is switched off. In a state prior to receiving a rising edge of clock signal 210, output node 1505 is electrically coupled to ground, and output node 1504 is driven to a logic high level via load 1501 in response to electrically coupling output node 1505 to ground. In this state, transistor 1536 is switched off and transistor 1534 is switched on.

Responsive to receiving a rising edge of clock signal 210, transistor 1532 is switched on and transistor 1538 is switched off as clock signal 210B provides a falling edge. Accordingly, output node 1504 is pulled down to a logic low level as it is electrically coupled to node 1506 via transistor 1532. Responsively, transistor 1534 is switched off, and output node 1505 is driven to a logic high level via load 1501 thereby propagating such a rising edge of clock signal 210 into output signal 1320. Responsive to output node 1505 going to a logic high level, transistor 1536 is switched on.

Accordingly, output states are latched until a falling edge reference enable signal 1318 of FIG. 13C is received causing phase control signal 237 to transition from a logic low state to a logic high state. Such a transition electrically decouples node 1506 from ground 1309 and electrically couples node 1507 to ground 1309. This means that controller 1500 goes from providing outputs responsive to clock signals 210 and 210B to providing outputs responsive to oscillator signals 208 and 208B, namely, changes state from hard-phase alignment state 1313 to oscillator alignment state 1312.

Notably, for controller 1500, output nodes 1504 and 1505 are electrically coupled to ground 1309 by as few as two n-type transistors in source/drain series each for oscillator alignment state 1312, where one n-type ground coupling transistor is shared by both output nodes. For hard-phase alignment state 1313, output node 1504 is electrically coupled to ground by as few as three n-type transistors in source/drain series and output node 1505 is electrically coupled to ground by as few as four n-type transistors in source/drain series, where two n-type ground coupling transistors are shared by both output nodes.

Notably, for controller 1300 of FIG. 13A, output nodes 1304 and 1305 are electrically coupled to ground 1309 by as few as two n-type transistors in source/drain series each for oscillator alignment, with the option of having a helper p-type transistor connected in source/drain parallel with an n-type ground coupling transistor shared by both output nodes. For hard-phase alignment, output node 1304 is electrically coupled to ground by as few as two n-type transistors in source/drain series and output node 1305 is electrically coupled to ground by as few as three n-type transistors in source/drain series, with the option of having a helper p-type transistor connected in source/drain parallel with an n-type ground coupling transistor shared by both output nodes.

Accordingly, having so few transistors to switch on and off to propagate oscillator or clock signals, facilitates continuity of signal transfer from input to output of a controller.

Notably, though propagating a rising edge is described, alternatively, a falling edge may be propagated. It should be understood that because an output frequency differs from a reference input frequency, as described above, only either rising or falling edges are propagated.

Figure 16:
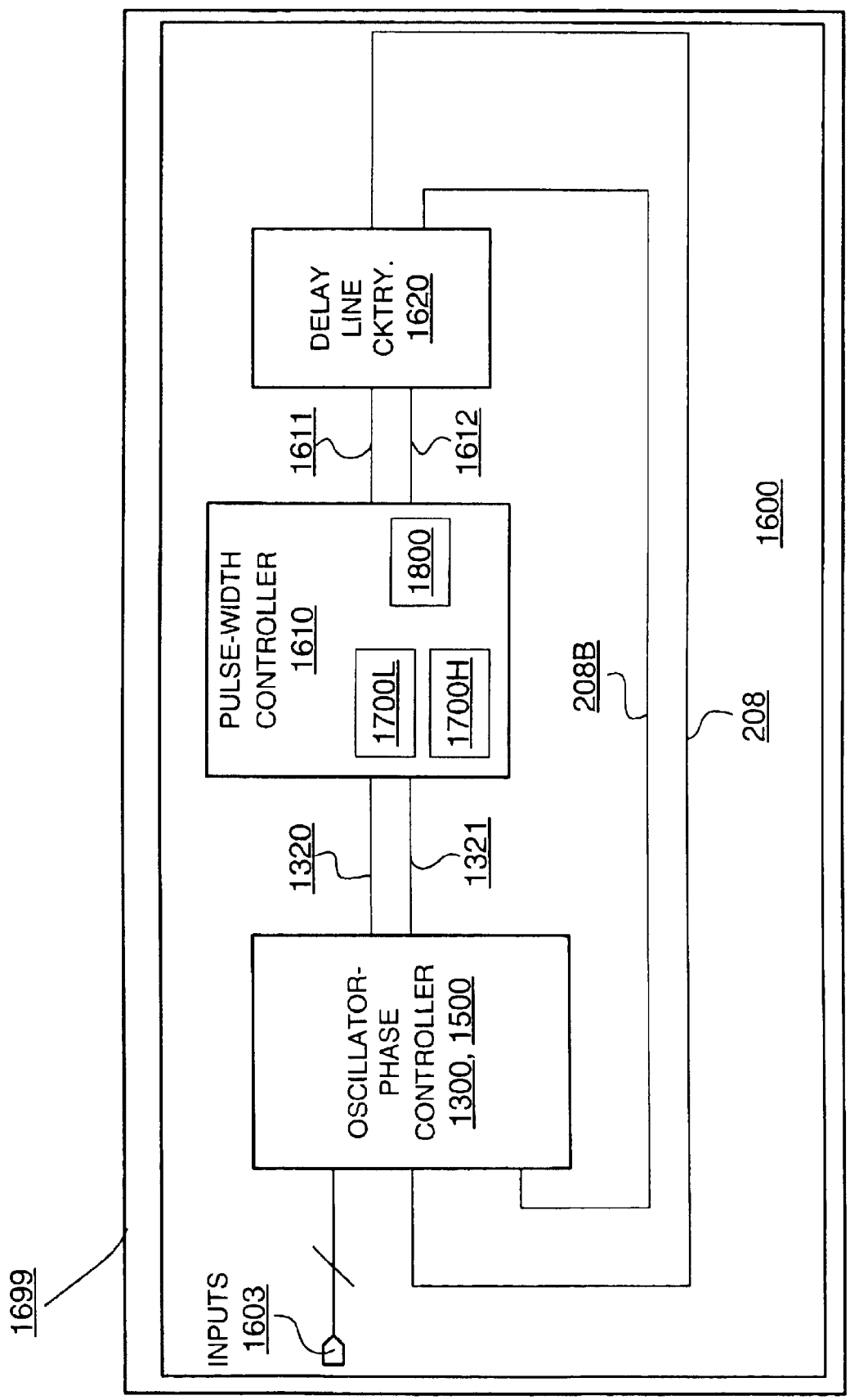
FIG. 16 is a block diagram depicting an exemplary embodiment of a digital frequency synthesis subsystem or system ("System").

FIG. 16 is a block diagram depicting an exemplary embodiment of a digital frequency synthesis subsystem or system ("system") 1600. System 1600 includes either oscillator-phase controller 1300 or 1500, pulse-width controller 1610 and delay line circuitry 1620. For clarity, controller 1300 will be assumed to be used though either controller 1300 or 1500 may be used. System 1600 may be part of a larger system, such as a DCM 1699. DCM 1699 may be part of a programmable logic device, such as an FPGA, as previously described.

Inputs 1603 to controller 1300 have previously been described, and their description is not repeated here, except that oscillator signal 208 and oscillator signal 208B may be feedback signals from delay line 1620 to controller 1300. Notably, in this embodiment, oscillator signals 208 and 208B are CMOS signals, though DCVSL signaling may be used. Delay line circuitry 1620 is configured to provide a differential output, namely, output oscillator signals 208 and 208B.

Outputs 1320, 1321 from controller 1300 are provided as inputs to controller 1610. Pulse-width controlled output signal 1611 and an inverted version thereof, namely, output signal 1612, are provided from pulse-width controller 1610.

One or both of output signals 1611 and 1612 are provided as inputs to delay line circuitry 1620. Output signals 1611 and 1612 are of a DCVSL form, and thus it should be understood that such signals may be buffered with CMOS elements of delay line circuitry 1620. Notably, delay line circuitry 1620 may source from one or both of output signals 1611 and 1612 to provide an oscillator output. If only one output signal 1611 or 1612 is sourced, delay line circuitry 1620 uses one delay line to provide an output signal, as illustratively shown, where a complemented signal type may be obtained from inverter 1621. Or, if both output signals 1611 and 1612 are sourced, delay line circuitry 1620 uses one delay line for each signal source to provide respective oscillator outputs and inverter 1621 may be omitted.

Pulse-width controller 1610 may be coupled to the output of controller 1300 or generally used to control pulse width absent coupling to controller 1300. More particularly, pulse-width controller 1610 may be used where there is a possibility of an input having a relatively narrow pulse width where it is desirable to extend the pulse width. For example, it may be desirable to use pulse-width controller 1610 to mitigate against jitter such that pulses fall within some minimum and maximum pulse width, namely, a minimum duration of time and a maximum duration of time. Pulse-width controller 1610 includes pulse generators 1700 and pulse width control circuit 1800.

For the description of pulse generators 1700 and pulse width control circuit 1800, the term "clock signals" is used as pulse generators 1700 and pulse width control circuit 1800 are clocked or obtain associated propagated signals using such "clock signals;" however, it should be understood that such clock signals are actually produced from an oscillator signal and a clock signal as previously described. However, in other embodiments, pulse-width controller 1610 may be used for signals other than above-described types of signals.

Pulse-Width Controller

Figure 17:
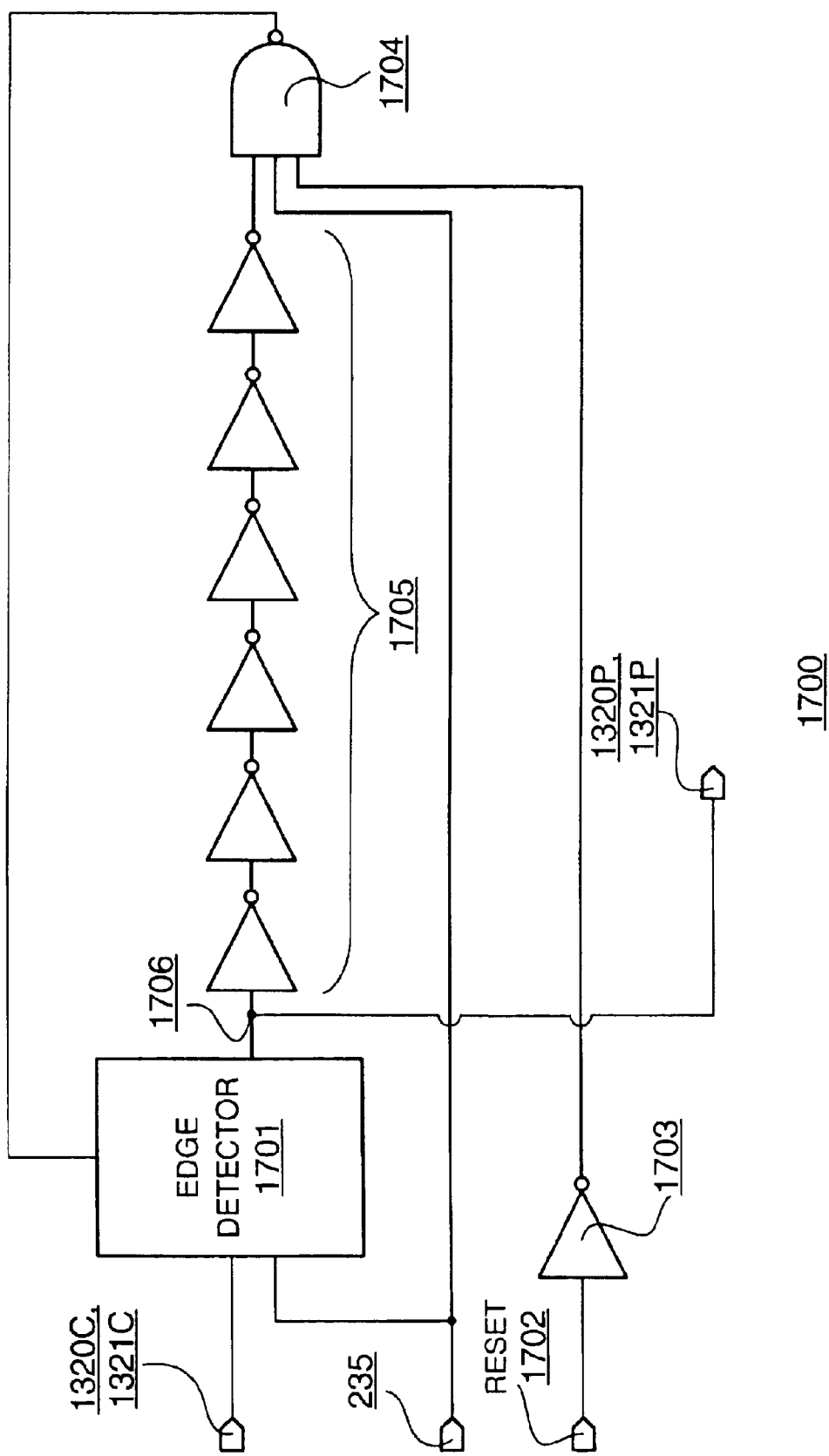
FIG. 17 is a schematic/block diagram depicting an exemplary embodiment of pulse generator.

FIG. 17 is a schematic/block diagram depicting an exemplary embodiment of pulse generator 1700. Pulse generator 1700 includes edge detector 1701, a series of delays 1705, and logic gate 1704. Edge detector 1701 may be an asynchronous edge detector, such as an asynchronous level mode edge detector, or a synchronous edge detector, such as a flip-flop.

Input to edge detector 1701 is a clocking signal, such as either an input clock signal 1320C or 1321C, where the "C" denotes CMOS signaling. Input clock signals 1320C and 1321C are CMOS versions of DCVSL output signals 1320 and 1321, respectively. Notably, for handling both input clock signals 1320C and 1321C, two pulse generators may be used to provide respective pulse width controlled output clock signals 1320P and 1321P. However, for purposes of clarity, it is assumed that input clock signal 1321C is used as a clocking signal to obtain output clock signal 1321P, as it will be apparent from such description how output clock signal 1320P may be obtained from input clock signal 1320C.

Output from edge detector 1701 may be from a positive or negative logic output port to provide pulse-width controlled output clock signal 1321P. Optionally, a clock enable signal, such as inverted stop oscillator signal 235, may be input to edge detector 1701. Furthermore, reset signal 1702 may be input to inverter 1703, and the output of inverter

1703 may be input to a logic gate, such as NAND gate 1704, for resetting pulse generator 1700.

Output from edge detector may be obtained at node 1706, and such output is provided to a chain of delay elements 1705. Though inverters are shown, other logic elements may be used. For inverters, an even number of inverters 1705 are connected in series.

Output from edge detector, for example a high logic level voltage, is delayed by delay elements 1705 and input to NAND gate 1704. Output of NAND gate 1704 is provided to a reset port of edge detector 1101. Either positive or negative edge detection may be used. Notably, for clock enable held active and reset held off, input to a reset port of edge detector 1701 should toggle with each clock cycle, such that output to node 1706 oscillates with either leading or lagging edges of input clock signal 1321C. Series or chain of delay elements 1705 and logic gate 1704 provide a delay from such leading or lagging edges to provide a pulse width within a targeted range. Though six delay elements 1705 are shown connected in series, fewer or more delay elements may be used to tailor delay to such a targeted range.

Figure 18A:
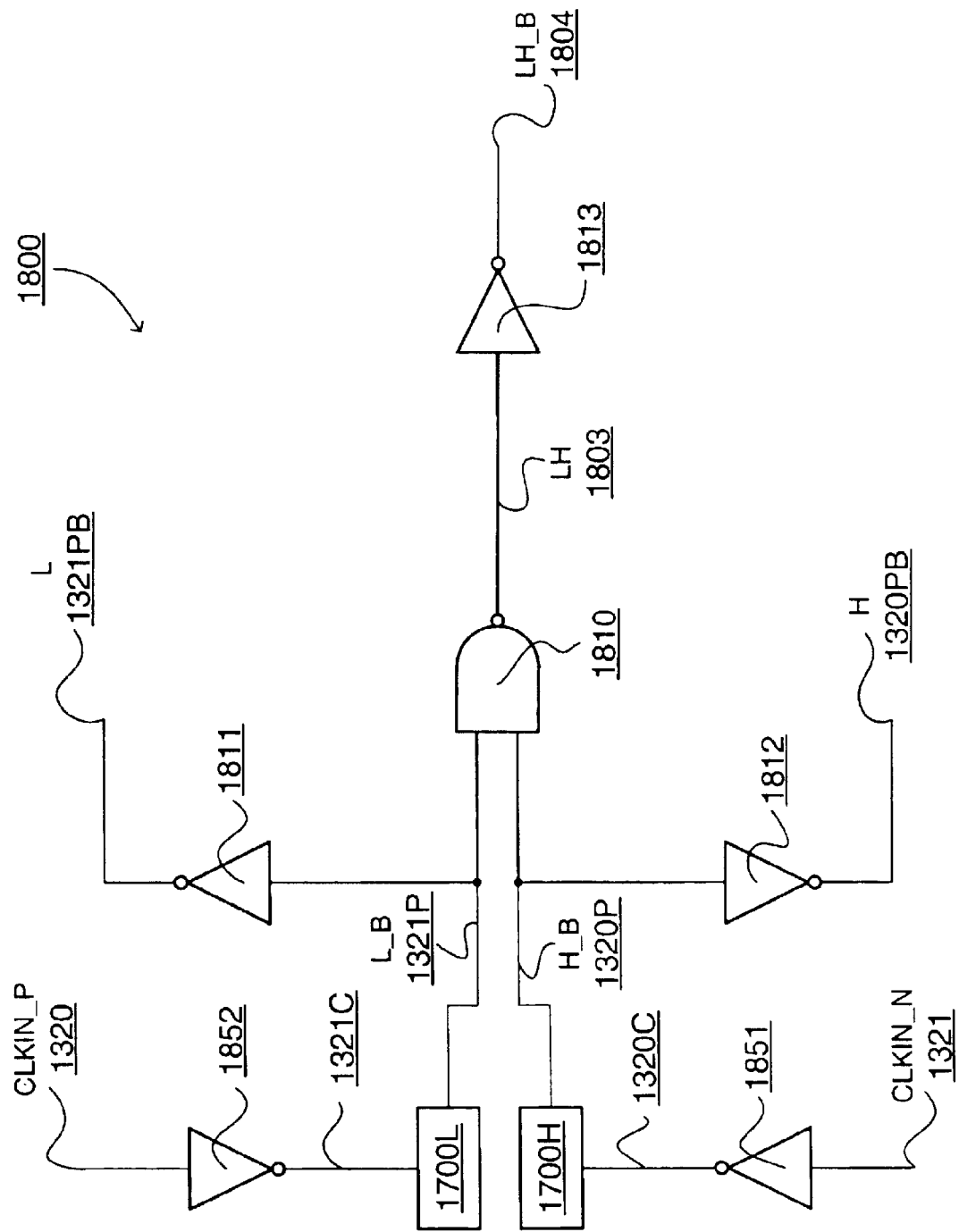
FIG. 18A is a schematic diagram depicting an exemplary embodiment of pulse generators connected to an input signal generation portion of a pulse width control circuit.

FIG. 18A is a schematic diagram depicting an exemplary embodiment of pulse generators 1700L and 1700H connected to an input signal generation portion of pulse width control circuit 1800. DCVSL input clock signal ("CLKIN_N") 1321 is a negative logic side input clock signal which is provided to inverter 1851 to obtain input clock signal 1320C. Input clock signal 1320C is provided to pulse generator 1700H to obtain clock signal ("H_B") 1320P, namely, a complemented "high time" clock signal ("H"). By "high time," it is meant logic high pulses are narrower than 50% of the period of the clock.

DCVSL output signal ("CLKIN_P") 1320 is provided to inverter 1852 to obtain input clock signal 1321C. Input clock signal 1321C is provided to pulse generator 1700L to obtain output clock signal ("L_B") 1321P, namely, a complemented "low time" clock signal ("L"). By "low time," it is meant logic low pulses are narrower than 50% of the period of the clock.

Figure 18B:
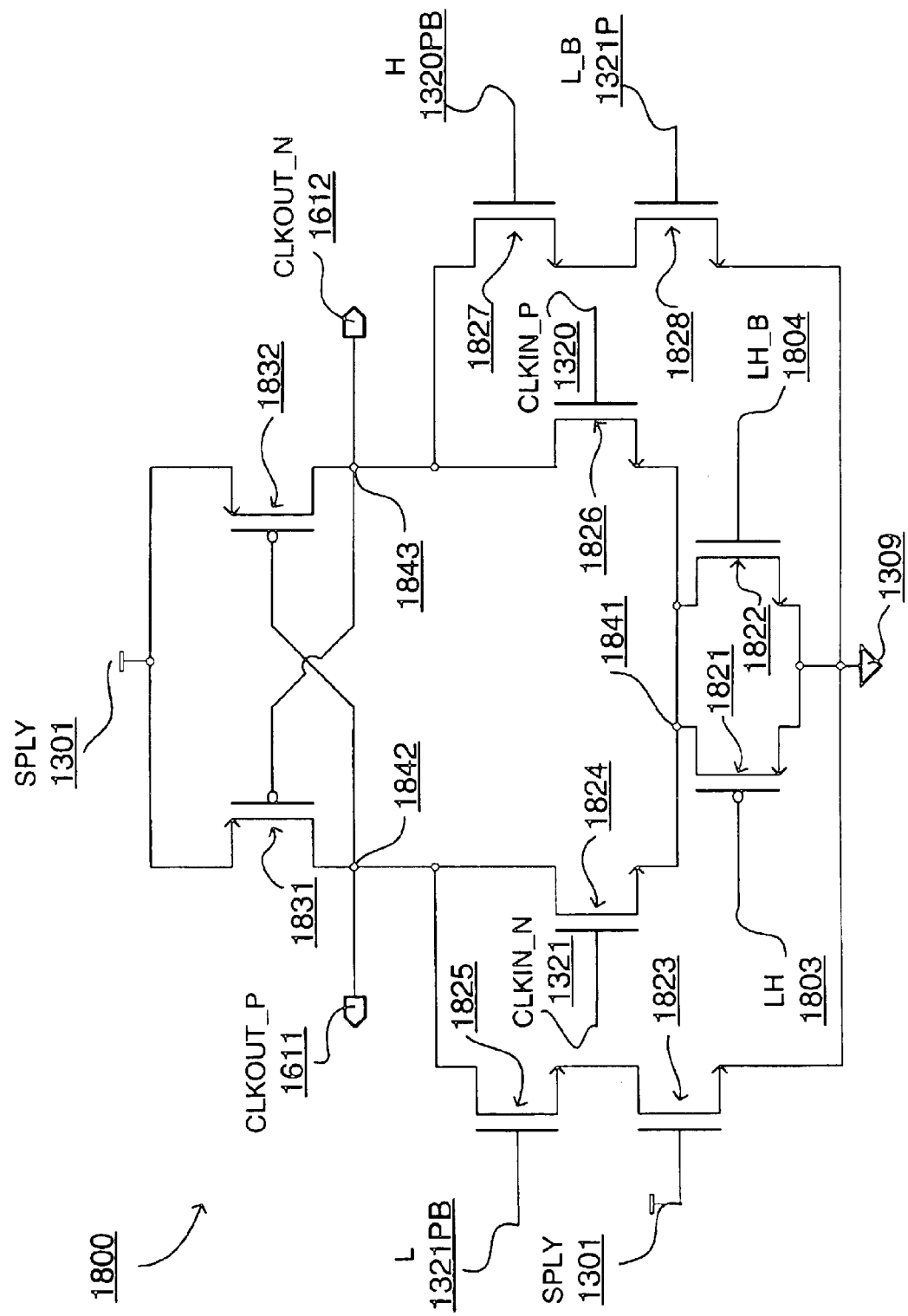
FIG. 18B is a schematic diagram depicting an exemplary embodiment of a duty-cycle adjustment portion of a pulse width control circuit.
Figure 19:
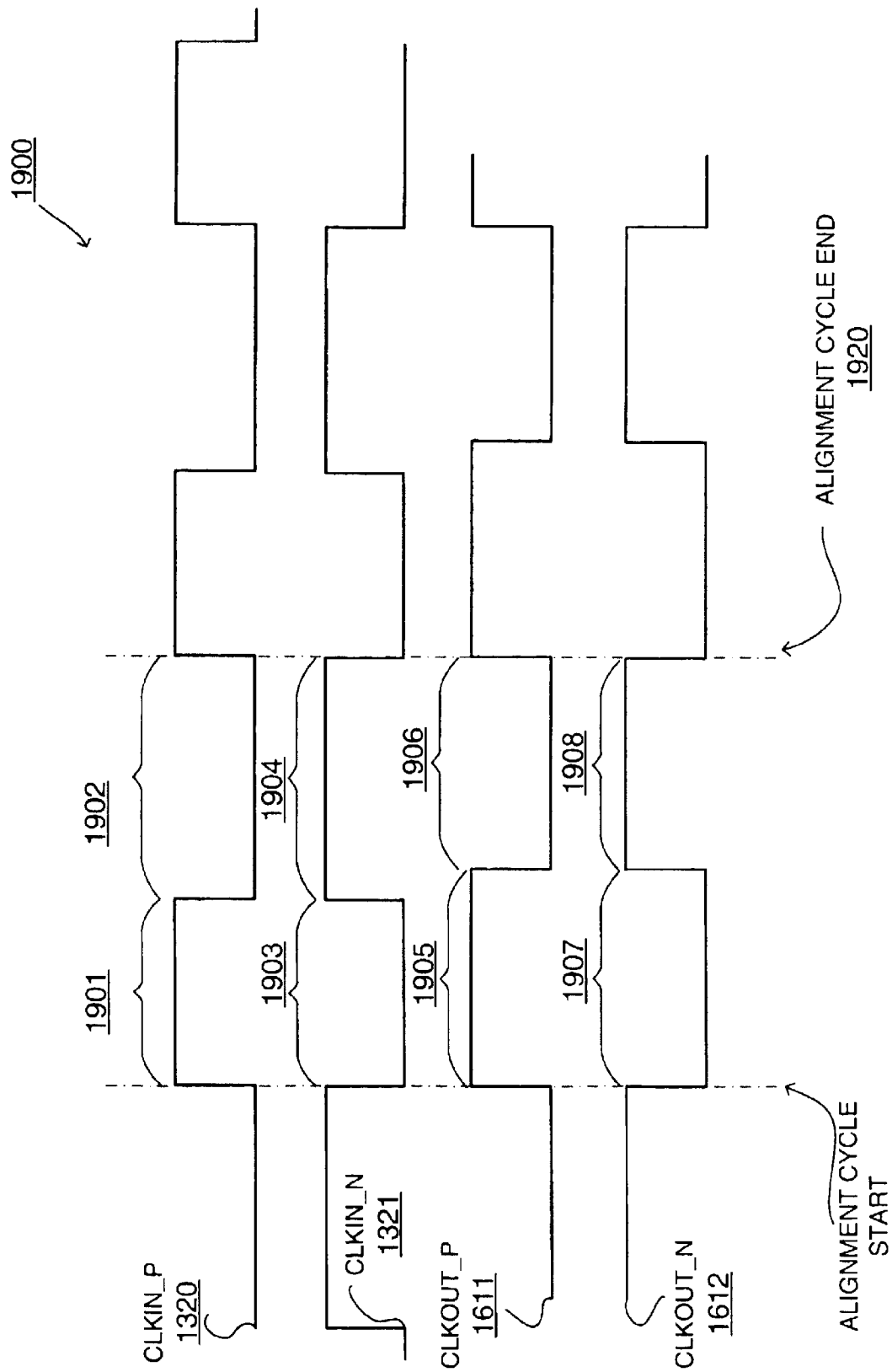
FIG. 19 is a high-level timing diagram depicting an exemplary embodiment of clock input to output signaling for the pulse width control circuit of FIGS. 18A and 18B.

FIG. 19 is a high-level timing diagram depicting an exemplary embodiment of clock input to output signaling 1900 for pulse width control circuit 1800 of FIGS. 18A and 18B. Positive logic clock input signal 1320 has a logic high pulse width 1901 and a logic low pulse width 1902. Pulse width 1901 is narrower than pulse width 1902. Accordingly, clock input signal 1320 is a high time signal.

Negative logic clock input signal 1321 has a logic high pulse width 1904 and a logic low pulse width 1903. Low pulse width 1903 is narrower than high pulse width 1904. Accordingly, clock input signal 1320 is a low time signal.

After duty cycle adjustment, positive logic clock output signal 1611 and negative logic clock output signal 1612 are respective duty-cycle adjusted versions of clock signals 1320 and 1321. Accordingly, logic high pulse width 1905 and logic low pulse width 1906 of clock output signal 1611 are at least approximately the same width. Moreover, logic high pulse width 1908 and logic low pulse width 1907 of clock output signal 1612 are at least approximately the same width. Thus, for each output signal duty cycle, for example from an alignment cycle start 1910 to alignment cycle end 1920, high and low pulse widths are at least approximately equal.

With renewed reference to FIG. 18A, input signal generation portion of pulse width control circuit 1800 is further described.

Output clock signal 1321P is input to inverter 1811 to obtain an inverted version thereof, namely, output clock signal 1321PB. Output clock signal 1320P is input to inverter 1812 to obtain an inverted version thereof, namely, output clock signal 1320PB. Output clock signals 1320P and 1321P are inputs to NAND gate 1810. Because duty cycles of output clock cycles 1320P and 1321P may not be 50%—50%, there will be instances when both inputs to NAND gate 1810 will be logic high or both logic low, and of course other instances where one input is logic high and the other input is logic low.

Output of NAND gate 1810 is low-high signal ("LH") 1803 which is provided as an input to inverter 1813. Output of inverter 1813 is an inverted version of low-high signal 1803, namely, complemented low-high signal ("LH_B") 1804. Thus, when low-high signal 1803 is at a logic low level, both output clock signals 1320P and 1321P are at a logic high level, and when low-high signal 1803 is at a logic high level, at least one of clock signals 1320P and 1321P is at a logic low level.

FIG. 18B is a schematic diagram depicting an exemplary embodiment of a duty-cycle adjustment portion of pulse width control circuit 1800. It is assumed that at least approximately a 50%—50% duty cycle is to be output for DCVSL output signals 1611 and 1612. This is facilitated by signal symmetry provided with respect to DCVSL in contrast to CMOS signaling. However, duty-cycle adjustment portion transistors may be sized to provide a duty cycle other than approximately a 50%—50% duty cycle. N-type transistors 1823 through 1828 form a DCVSL portion of pulse width control circuit 1800.

Positive logic output clock signal 1611 is sourced from output node 1842, and negative logic output clock signal 1612 is sourced from output node 1843. Output nodes 1842 and 1843 are coupled to supply voltage 1301 via cross-coupled p-type transistors 1831 and 1832. A gate terminal of transistor 1832 is connected to output node 1842, and a gate terminal of transistor 1831 is connected to output node 1843. Source terminals of transistors 1831 and 1832 are respectively electrically coupled to supply voltage source 1301. A drain terminal of transistor 1832 is connected to output node 1843, and a drain terminal of transistor 1831 is connected to output node 1842. As described above, cross-coupled p-type transistors are used to provide loading for establishing an inverted relationship between respective outputs at output nodes.

N-type transistor 1825 is gated with CMOS clock signal 1321PB. Recall that clock signal 1321P is the logic low narrow pulse width controlled signal, and thus an inverted version of clock signal 1321P, namely, clock signal 1321PB has logic high narrow pulse widths. A drain terminal of n-type transistor 1825 is connected to output node 1842, and a source terminal of transistor 1825 is connected to a drain terminal of n-type transistor 1823. A gate terminal of transistor 1823 is electrically coupled to supply voltage source 1301, and a source terminal of transistor 1823 is electrically coupled to ground 1309. Transistor 1823 is merely included for layout symmetry, and may be omitted, where a source terminal of transistor 1825 is electrically coupled to ground 1309.

N-type transistor 1824, having its drain terminal connected to output node 1842, is gated with DCVSL clock signal 1321. A source terminal of transistor 1824 is connected to node 1841. Recall that clock signal 1321 is a negative side output of controller 1300. However, in other embodiments a CMOS or DCVSL complemented clock signal may be used.

N-type transistor 1827, having its drain terminal connected to output node 1843, is gated with clock signal 1320PB. Recall that clock signal 1320P is the logic high narrow pulse width controlled signal, and thus an inverted version of clock signal 1320P, namely, clock signal 1320PB has logic low narrow pulse widths. A source terminal of transistor 1827 is connected to a drain terminal of n-type transistor 1828. Transistor 1828 is gated with clock signal 1321P. Recall that clock signal 1321P is the logic low narrow pulse width controlled signal, and thus clock signal 1321P has logic low narrow pulse widths. A source terminal of transistor 1828 is electrically coupled to ground 1309.

A drain terminal of n-type transistor 1826 is connected to output node 1843. Transistor 1826 is gated with clock signal 1320. Recall that clock signal 1320 is a positive side output of controller 1300. However, in other embodiments a CMOS or DCVSL complemented clock signal may be used. A source terminal of transistor 1826 is connected to node 1841.

Drain terminals of p-type transistor 1821 and n-type transistor 1822 are commonly connected to node 1841, and source terminals of p-type transistor 1821 and n-type transistor 1822 are commonly electrically coupled to ground 1309.

With simultaneous reference to FIGS. 18A and 18B, operation of pulse width control circuit 1800 is further described. Notably, inverted low time clock input signal 1321P is given priority. However, priority may be for either a low time signal or a high time signal.

For inverted low time clock signal 1321P and inverted high time clock signal 1320P both being logic high, output of NAND gate 1810 is logic low. Transistors 1821 and 1822 are switched on, and transistors 1825 and 1827 are switched off. Accordingly, output node 1842 is electrically coupled to and decoupled from ground 1309 with the switching on and off of transistor 1824 responsive to clock input signal 1321, and output node 1843 is electrically coupled to and decoupled from ground 1309 with the switching on and off of transistor 1826 responsive to clock input signal 1320. When output node 1842 is logic low, output node 1843 is electrically coupled to supply voltage source 1301 via transistor 1832, and when output node 1843 is logic low, output node 1842 is electrically coupled to supply voltage source 1301 via transistor 1831. It should be appreciated that for output of NAND gate 1810 logic low, control of pulse width control circuit 1800 is transferred in part to transistors 1824 and 1826. In all other instances, at least one of high time clock signal 1320PB and low time clock signal 1321PB will be logic high and output of NAND gate 1810 will be logic high thereby electrically decoupling transistors 1824 and 1826 from ground 1309.

Responsive to a rising edge of positive logic clock input signal 1320, clock signal 1321PB transitions to logic low, and clock signals 1320PB and 1321P transition to logic high. With transistors 1827 and 1828 switched on and transistor 1825 switched off, output node 1843 is electrically coupled to ground 1309 and output node 1842 is driven to logic one. Some time thereafter, clock signal 1320PB transitions from logic high to logic low transferring control to transistor 1826 gated by clock signal 1320 which is logic high.

After transfer of control to transistor 1826, input clock signal 1321P transitions from logic high to logic low and thus input clock signal 1321PB transitions from logic low to logic high to transfer control from transistor 1826 to transistor 1825. However, this transfer of control will not take place until the logic high pulse width of a pulse of input clock signal 1321P is expended. Because such logic high pulse width of input clock signal 1321P has been pulse width lengthened as previously described, output node 1843 is held electrically coupled to ground via clock signal 1320 as applied to transistor 1826 for a period of time associated with such pulse width lengthening. In other words, output clock signal 1611 is held at a logic high state for a time within a target pulse width. After which time, control is transferred from transistor 1826 to transistor 1825. Switching on of transistor 1825 causes output node 1842 to be correspondingly coupled to ground via always on transistor 1823, and thus output clock signal 1611 transitions from a logic high level to a logic low level responsive to transistor 1825 being switched to an on state.

Approximately a 50%—50% duty cycle for output clock signals 1611 and 1612 is produced. This is done at least in part by transferring control from transistor 1825 to transistors 1827 and 1828, and vise versa, at approximately a 50%—50% rate for respectively providing output clock signals 1611 and 1612.

Responsive to a rising edge of negative logic clock input signal 1321, clock signal 1321PB transitions to logic high, and clock signals 1320PB and 1321P transition to logic low. With transistors 1827 and 1828 switched off and transistor 1825 switched on, output node 1842 is electrically coupled to ground 1309 and output node 1843 is driven to logic one. Some time thereafter, clock signal 1321PB transitions from logic high to logic low transferring control to transistor 1824 gated by clock signal 1321 which is logic high.

After transfer of control to transistor 1824, input clock signals 1321P and 1320PB transition from logic low to logic high and thus input clock signal 1321PB transitions from logic high to logic low to transfer control from transistor 1824 to transistors 1827 and 1828. However, this transfer of control will not take place until the logic low pulse width of a pulse of input clock signal 1321P is expended. Because such a logic low pulse width of input clock signal 1321P has been pulse width lengthened as previously described, output node 1842 is held electrically coupled to ground via clock signal 1321 as applied to transistor 1824 for a period of time associated with such pulse width lengthening. In other words, output clock signal 1612 is held at a logic high state for a time within a target pulse width. After which time, control is transferred from transistor 1824 to transistors 1827 and 1828. Switching on of transistors 1827 and 1828 causes output node 1843 to be pulled to ground thereby causing output clock signal 1612 to transition from a logic high level to a logic low level.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. For example, though a differential clock input and a differential oscillator input are described with respect to a signal and an inverted version of the signal, the difference for such differential inputs does not have to be a seperation provided by a signal and its inverted version, as another difference in signaling may be used to provide a differential input Claim(s) listing steps do not imply any order the steps.

What is claimed is:

1. An oscillator controller in an integrated circuit, comprising:
    differential logic for receiving a differential clock input and a differential oscillator input, the differential clock input associated with a clock signal, the differential oscillator input associated with an oscillator signal, the clock signal and the oscillator signal having different frequencies;
    the differential logic configured to provide a differential output at least partially responsive to at least one of the clock signal and the oscillator signal; and control logic for receiving control signals, the control logic configured to put the differential logic in one of three states in response to the control signals, the three states including a first state for propagating by the differential logic an edge of the clock signal to the differential output for a hard-phase alignment.

2. The oscillator controller, according to claim 1, wherein the three states are for a pre-lock condition and a post-lock condition, the pre-lock condition being prior to frequency locking to the clock signal, and the post-lock condition being after frequency locking to the clock signal.

3. The oscillator controller, according to claim 2, wherein the first state occurs during the post-lock condition.

4. The oscillator controller, according to claim 3, wherein the three states include a second state for propagating by the differential logic the oscillator signal to the differential output.

5. The oscillator controller, according to claim 4, wherein the second state occurs during the post-lock condition.

6. The oscillator controller, according to claim 5, wherein the three states include a third state for propagating by the differential logic a control signal of the control signals to the differential output.

7. The oscillator controller, according to claim 6, wherein the third state occurs during the pre-lock condition.

8. The oscillator controller, according to claim 5, wherein the control signals comprise a first control signal and a second control signal; and wherein the first control signal transitions from a first voltage level to a second voltage level responsive to overlap between a concurrence signal and a reference concurrence signal to put the differential logic in the first state.

9. The oscillator controller, according to claim 8, wherein the second control signal transitions from the first voltage level to the second voltage level responsive to the differential logic transitioning from the pre-lock condition to the post-lock condition.

10. The oscillator controller, according to claim 9, wherein the first control signal and the second control signal are respectively provided to inverters in series to obtain phase control signals.

11. The oscillator controller, according to claim 9, wherein all of the control signals are obtained from the first control signal and the second control signal.

12. The oscillator controller, according to claim 9, wherein the differential logic is Differential Cascode Voltage Switch Logic formed entirely of n-type transistors.

13. An oscillator controller in an integrated circuit, comprising:
differential logic for receiving a differential clock input and a differential oscillator input, the differential clock input associated with a clock signal, the differential oscillator input associated with an oscillator signal, the clock signal and the oscillator signal having different frequencies;
the differential logic configured to provide a differential output at least partially responsive to at least one of the clock signal and the oscillator signal;
the differential logic configured to provide a combinational circuit in an oscillator alignment state and to provide a sequential circuit in a hard-phase alignment state; and
control logic for receiving control signals, the control logic in part to selectively alternate between putting the differential logic in the oscillator alignment state and in the hard-phase alignment state responsive to the control signals.

14. The oscillator controller, according to claim 13, wherein the differential logic is configured to propagate an edge of the clock signal to the differential output in the hard-phase alignment state and to provide feedback from the differential output representing a change in logic level responsive the edge propagated, the feedback provided asynchronously in advance of another edge of the clock signal immediately following the edge to prevent the other edge from being propagated to the differential output.

15. The oscillator controller, according to claim 14, wherein the control signals selectively cause the differential logic to transition from the hard-phase alignment state to the oscillator alignment state after the feedback is asynchronously provided to propagate the oscillator signal to the differential output.

16. The oscillator controller, according to claim 15, wherein the feedback establishes a signal state latch within the differential logic.

17. The oscillator controller, according to claim 16, wherein the differential logic is Differential Cascode Voltage Switch Logic formed entirely of n-type transistors.

18. The oscillator controller, according to claim 17, wherein the differential logic and the control logic are part of a digital clock management circuit.

19. The oscillator controller, according to claim 17, wherein the integrated circuit is a field programmable gate array.

20. An oscillator controller in an integrated circuit, comprising:
first means for receiving a differential clock input and a differential oscillator input, the differential clock input associated with a clock signal, the differential oscillator input associated with an oscillator signal, the clock signal and the oscillator signal having different frequencies;
the first means configured to provide a differential output at least partially responsive to at least one of the clock signal and the oscillator signal;
the first means configured to provide a combinational circuit in an oscillator alignment state and to provide a sequential circuit in a hard-phase alignment state;
second means for receiving control means, the second means in part for selectively alternating between putting the first means in the oscillator alignment state and in the hard-phase alignment state responsive to the control means.

21. An oscillator controller in an integrated circuit, comprising:
first means for receiving a differential clock input and a differential oscillator input, the differential clock input associated with a clock signal, the differential oscillator input associated with an oscillator signal, the clock signal and the oscillator signal having different frequencies;
the first means configured to provide a differential output at least partially responsive to at least one of the clock signal and the oscillator signal; and
second means for receiving control means, the second means, configured to put the first means in one of three states in response to the control means, the three states including a first state for propagating by the first means an edge of the clock signal to the differential output for a hard-phase alignment.

* * * * *